United States Patent
Shibata et al.

(10) Patent No.: US 7,126,261 B2
(45) Date of Patent: Oct. 24, 2006

(54) PIEZOELECTRIC/ELECTROSTRICTIVE DEVICE AND METHOD FOR MANUFACTURING THE SAME

(75) Inventors: Kazuyoshi Shibata, Mizunami (JP); Koji Ikeda, Hisai (JP); Masashi Watanabe, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/007,963

(22) Filed: Dec. 9, 2004

(65) Prior Publication Data

US 2005/0179344 A1    Aug. 18, 2005

Related U.S. Application Data

(63) Continuation of application No. PCT/JP03/07312, filed on Jun. 10, 2003.

(30) Foreign Application Priority Data

Jun. 10, 2002    (JP)    ............................ 2002-169265

(51) Int. Cl.
  *H01L 41/083*    (2006.01)
  *H01L 41/047*    (2006.01)
(52) U.S. Cl. ...................... 310/366; 310/328; 29/25.35
(58) Field of Classification Search ................ 310/328, 310/330, 331, 366
  See application file for complete search history.

(56) References Cited

U.S. PATENT DOCUMENTS 4,398,325 A * 8/1983 Piaget et al. ............... 29/25.35

5,252,883 A    10/1993 Kondo ........................ 30/328
6,809,459 B1 * 10/2004 Ikeda et al. ............ 310/323.11
6,813,815 B1 * 11/2004 Namerikawa et al. ..... 29/25.35

FOREIGN PATENT DOCUMENTS

| JP | 58-6462 | * | 1/1983 | ................ 29/25.35 |
| JP | 03-087079 | | 4/1991 | |
| JP | 06-120579 | | 4/1994 | |
| JP | 06-151999 | | 5/1994 | |
| JP | 2002-26411 | | 1/2002 | |
| JP | 2002-374012 | | 12/2002 | |
| WO | 01/26167 A1 | | 4/2001 | |

* cited by examiner

*Primary Examiner*—Thomas M. Dougherty
(74) *Attorney, Agent, or Firm*—Burr & Brown

(57) ABSTRACT

A piezoelectric/electrostrictive device 10 includes a stationary portion 11; a thin-plate portion 12 supported by the stationary portion; and a piezoelectric/electrostrictive element 14 including a plurality of electrodes and a plurality of piezoelectric/electrostrictive layers arranged alternatingly In layers. The piezoelectric/electrostrictive device 10 is manufactured by the steps of forming a piezoelectric/electrostrictive laminate by alternatingly laminating laminar electrodes and piezoelectric/electrostrictive layers on a plane of a thin-plate member adapted to form the thin-plate portion 12, and cutting the thin-plate member and the piezoelectric/electrostrictive laminate. The cutting step is performed by advancing a wire member (wire saw) reciprocating in a direction parallel to the direction of lamination of the piezoelectric/electrostrictive laminate while holding the wire member substantially parallel to the direction of lamination. Thus, since the laminar electrodes are cut while being extended within corresponding layer planes, the degree of covering the end surfaces of the piezoelectric/electrostrictive layers decreases.

5 Claims, 20 Drawing Sheets

US 7,126,261 B2

PIEZOELECTRIC/ELECTROSTRICTIVE DEVICE AND METHOD FOR MANUFACTURING THE SAME

CROSS REFERENCE TO RELATED APPLICATIONS

This application is a continuation of International Application No. PCT/JP03/07312, having an international filing date of Jun. 10, 2003, which designated the United States, the entirety of which is incorporated herein by reference.

This application claims the benefit of Japanese Application 2002-169265, filed Jun. 10, 2002, the entirety of which is incorporated herein by reference.

TECHNICAL FIELD

The present invention relates to a piezoelectric/electrostrictive device including a stationary portion, a thin-plate portion supported by the stationary portion, and a piezoelectric/electrostrictive element including laminar electrodes and piezoelectric/electrostrictive layers, and to a method for manufacturing the same.

BACKGROUND ART

A piezoelectric/electrostrictive device of the above-mentioned type has been developed as an actuator for precision working; as an actuator for controlling the position of a read and/or write element (head) for reading and/or writing optical information, magnetic information, or like information; as a sensor for converting mechanical vibration to an electrical signal; or as a like device.

FIG. 25 shows an example of such a piezoelectric/electrostrictive device The piezoelectric/electrostrictive device includes a stationary portion 100; thin-plate portions 110 supported by the stationary portion 100; holding portions (movable portions) 120 provided at corresponding tip ends of the thin-plate portions 110 and adapted to hold an object; and piezoelectric/electrostrictive elements 130 formed at least on corresponding planes of the thin-plate portions 110, each piezoelectric/electrostrictive element 130 including a plurality of electrodes and a plurality of piezoelectric/electrostrictive layers arranged alternatingly in layers. An electric field is generated between electrodes of the piezoelectric/electrostrictive elements 130 to thereby extend and contract the piezoelectric/electrostrictive layers of the piezoelectric/electrostrictive elements 130, whereby the thin-plate portions 110 are deformed. The deformation of the thin-plate portions 110 causes displacement of the holding portions 120 (accordingly, displacement of the object held by the holding portions 120).

The piezoelectric/electrostrictive device of FIG. 25 is manufactured as follows. First, as shown in FIG. 26, a plurality of ceramic green sheets (and/or a ceramic green sheet laminate) are prepared. As shown in FIG. 27, these ceramic green sheets are laminated and then fired, thereby forming a ceramic laminate 200. As shown in FIG. 28, piezoelectric/electrostrictive laminates 210 each including a plurality of electrodes and a plurality of piezoelectric/electrostrictive layers arranged alternatingly in layers are formed on the surface of the ceramic laminate 200. The piezoelectric/electrostrictive laminates 210 are cut along cutting lines C1 to C4 shown in FIG. 29, thereby yielding the piezoelectric/electrostrictive device.

However, as shown in FIG. 30, an enlarged fragmentary front view of the lateral end surface of the thin-plate portion 110 and the piezoelectric/electrostrictive element 130, and in FIG. 31, an enlarged fragmentary, sectional view taken along line 1—1 of FIG. 30, when cutting is performed along the cutting lines C3 and C4 by use of a wire saw WS, ductility of electrodes 131 of the piezoelectric/electrostrictive element 130 causes the lateral end surface (cut surface) of each of the electrodes 131 to extend onto the lateral end surface of a piezoelectric/electrostrictive layer 132 located adjacently toward the direction of advancement of the wire saw WS (located adjacently downward in FIGS. 30 and 31). As a result, on the lateral end surface of the piezoelectric/electrostrictive element 130, the distance between the adjacent electrodes 131 is reduced. Furthermore, since the lateral end surface is exposed exteriorly, dust or the like tends to adhere thereto. As a result, it turned out that the adjacent electrodes are highly likely to short-circuit.

DISCLOSURE OF THE INVENTION

In view of the foregoing, an object of the present invention is to provide a piezoelectric/electrostrictive device in which a sufficient distance is maintained between electrodes as observed on the lateral end surface (cut surface) of a piezoelectric/electrostrictive element, by devising a method of cutting a piezoelectric/electrostrictive laminate, as well as to provide a method for manufacturing the same.

To achieve the above object, according to a feature of the present invention, a method for manufacturing a piezoelectric/electrostrictive device including a thin-plate portion, a stationary portion supporting the thin-plate portion, and a piezoelectric/electrostrictive element including a plurality of electrodes and a plurality of piezoelectric/electrostrictive layers arranged alternatingly in layers comprises a step of forming a piezoelectric/electrostrictive laminate by alternatingly laminating laminar electrodes and piezoelectric/electrostrictive layers on a plane of a thin-plate member adapted to form the thin-plate portion; and a step of forming the thin-plate portion and the piezoelectric/electrostrictive element by advancing a wire member reciprocating in a direction substantially parallel to the direction of lamination of the piezoelectric/electrostrictive laminate while holding the wire member substantially parallel to the direction of lamination, so as to cut the thin-plate member and the piezoelectric/electrostrictive laminate.

According to another feature of the present invention, a method for manufacturing a piezoelectric/electrostrictive device including a thin-plate portion, a stationary portion supporting the thin-plate portion, and a piezoelectric/electrostrictive element including a plurality of electrodes and a plurality of piezoelectric/electrostrictive layers arranged alternatingly in layers comprises a step of forming a ceramic laminate by firing a ceramic green sheet laminate including a ceramic green sheet adapted to form the stationary portion, and a ceramic green sheet adapted to form the thin-plate portion; a step of forming a piezoelectric/electrostrictive laminate at least on a surface of a portion of the ceramic laminate which is formed into the thin-plate portion, the piezoelectric/electrostrictive laminate including laminar electrodes and piezoelectric/electrostrictive layers arranged alternatingly in layers; and a step of forming the thin-plate portion and the piezoelectric/electrostrictive element by advancing a wire member reciprocating in a direction substantially parallel to the direction of lamination of the piezoelectric/electrostrictive laminate while holding the wire member substantially parallel to the direction of lamination, so as to cut the portion of the ceramic laminate which is formed into the thin-plate portion, and the piezoelectric/electrostrictive laminate.

According to the method of the present invention, the thin-plate member adapted to form the thin-plate portion, and the piezoelectric/electrostrictive laminate adapted to form the piezoelectric/electrostrictive element are cut by moving the wire member in a direction parallel to a layer plane, the wire member reciprocating in a direction substantially parallel to the direction of lamination of the piezoelectric/electrostrictive laminate (i.e., in a direction substantially perpendicular to the layer plane) while being held substantially parallel to the direction of lamination. Accordingly, force that is applied from the wire member to each of the electrodes in association with cutting and that acts on the electrode in such a manner as to extend the electrode is directed mainly in the layer plane of the electrode. Also, force that is generated in association with the reciprocating movement of the wire member during cutting and that acts on the electrode in such a manner as to extend the electrode is directed substantially evenly toward the lateral end surfaces of two piezoelectric/electrostrictive layers between which the electrode is sandwiched. As a result, the present invention provides the piezoelectric/electrostrictive device in which, on an exteriorly exposed lateral end surface (cut surface) of the piezoelectric/electrostrictive element, a relatively large distance is maintained between adjacent electrodes.

In other words, by use of the above-mentioned manufacturing method, the present invention can provide a piezoelectric/electrostrictive device comprising a thin-plate portion; a stationary portion supporting the thin-plate portion; and a piezoelectric/electrostrictive element formed at least on a plane of the thin-plate portion, the piezoelectric/electrostrictive element including a plurality of electrodes and a plurality of piezoelectric/electrostrictive layers arranged alternatingly in layers, and having an exteriorly exposed lateral end surface including lateral end surfaces of the plurality of electrodes and lateral end surfaces of the plurality of piezoelectric/electrostrictive layers; wherein a portion of each electrode which portion forms the corresponding lateral end surface extends onto both of the lateral end surfaces of the piezoelectric/electrostrictive layers between which the electrode is sandwiched, in such a manner as to partially cover the lateral end surfaces of the piezoelectric/electrostrictive layers.

The piezoelectric/electrostrictive device of the present invention is such that, on the lateral end surface of the piezoelectric/electrostrictive element, the length (L2) of a portion of each electrode which forms the corresponding lateral end surface of the electrode as measured in the direction of lamination of the piezoelectric/electrostrictive layers and the electrode is smaller than five times the length (L1) of the electrode as measured in the direction of lamination and on an imaginary plane (HPL) defined by the lateral end surfaces of the piezoelectric/electrostrictive layers.

Also, the piezoelectric/electrostrictive device of the present invention is such that a ratio of L3/L1 satisfies 0<L3/L1<2 (i.e., L3/L1 is greater than 0 and smaller than 2), where L3 is the length of the longer of parts of a lateral-end-surface-forming portion of each electrode which portion forms the corresponding lateral end surface of the electrode, the parts of the portion covering the corresponding lateral end surfaces of the piezoelectric/electrostrictive layers between which the electrode is sandwiched, the length being measured in the direction of lamination of the piezoelectric/electrostrictive layers and the electrode; and L1 is the thickness, as measured in the direction of lamination, of the lateral-end-surface-forming portion of the electrode after removal of the parts covering the corresponding lateral end surfaces of the piezoelectric/electrostrictive layers from the lateral-end-surface-forming portion of the electrode.

The piezoelectric/electrostrictive device in which the length (L2) of a portion of each electrode which forms the corresponding lateral end surface of the electrode is smaller than five times the length (L1) of the electrode as measured in the direction of lamination and on the imaginary plane (HPL) defined by the lateral end surfaces of the piezoelectric/electrostrictive layers, or the piezoelectric/electrostrictive device in which the ratio L3/L1 satisfies 0<L3/L1<2, is highly unsusceptible to a failure to exhibit sufficient insulating performance at the stage of completion of manufacture thereof and is highly unlikely to impair its insulating performance in the course of use.

The above-mentioned manufacturing method of the present invention provides a piezoelectric/electrostrictive device comprising a thin-plate portion; a stationary portion supporting the thin-plate portion; and a piezoelectric/electrostrictive element formed at least on a plane of the thin-plate portion, including a plurality of electrodes and a plurality of piezoelectric/electrostrictive layers arranged alternatingly in layers, having an exteriorly exposed lateral end surface including lateral end surfaces of the plurality of electrodes and lateral end surfaces of the plurality of piezoelectric/electrostrictive layers; wherein the exteriorly exposed lateral end surface of the piezoelectric/electrostrictive element is a surface formed by cutting a laminate of the electrodes and the piezoelectric/electrostrictive layers, in a direction substantially perpendicular to the direction of lamination of the laminate in a plane parallel to the direction of lamination.

According to a further feature of the present invention, a method for manufacturing a piezoelectric/electrostrictive device including a thin-plate portion and a piezoelectric/electrostrictive element including a laminar first electrode formed on a plane of the thin-plate portion, a piezoelectric/electrostrictive layer formed on the first electrode, and a laminar second electrode formed on the piezoelectric/electrostrictive layer comprises a step of forming a laminate adapted to form the piezoelectric/electrostrictive element, on a plane of a thin-plate member adapted to form the thin-plate portion; and a step of forming the thin-plate portion and the piezoelectric/electrostrictive element by advancing a wire member reciprocating in a direction substantially parallel to the direction of lamination of the laminate while holding the wire member substantially parallel to the direction of lamination, so as to cut the thin-plate member and the laminate.

Also, in this case, the thin-plate member adapted to form the thin-plate portion, and the laminate adapted to form the piezoelectric/electrostrictive element including the first and second electrodes and the piezoelectric/electrostrictive layer sandwiched between the first and second electrodes are cut by moving the wire member in a direction parallel to a layer plane, the wire member reciprocating in a direction substantially parallel to the direction of lamination of the piezoelectric/electrostrictive laminate (i.e., in a direction substantially perpendicular to the layer plane) while being held substantially parallel to the direction of lamination. Accordingly, force that is applied from the wire member to the first and second electrodes in association with cutting and that acts on the first and second electrodes in such a manner as to extend the electrodes is directed mainly in the layer planes of the first and second electrodes. As a result, the present invention provides the piezoelectric/electrostrictive device in which, on an exteriorly exposed lateral end surface (cut surface) of the piezoelectric/electrostrictive element, a relatively large distance is maintained between the first and second electrodes. In other words, the present invention provides the piezoelectric/electrostrictive device in which a portion of the first electrode which portion forms the lateral end surface thereof extends onto the lateral end surface of the thin-plate portion and onto the lateral end surface of the piezoelectric/electrostrictive layer in such a manner as to partially cover the lateral end surface of the thin-plate portion and the lateral end surface of the piezoelectric/electrostrictive layer, and in which a relatively large distance is maintained between the first and second electrodes as observed on the lateral end surface.

BEST MODE FOR CARRYING OUT THE INVENTION

An embodiment of a piezoelectric/electrostrictive device according to the present invention will next be described with reference to the drawings. As shown in the perspective view of FIG. 1, a piezoelectric/electrostrictive device 10 according to the present embodiment includes a stationary portion 11 in the shape of a rectangular parallelepiped; a pair of mutually facing thin-plate portions 12, which are supported by the stationary portion 11 in a standing condition; two holding portions (movable portions) 13 provided at corresponding tip ends of the thin-plate portions 12 and having a thickness greater than that of the thin-plate portions 12; and two piezoelectric/electrostrictive elements 14 formed at least on corresponding outer planes of the thin-plate portions 12 and including laminar electrodes and piezoelectric/electrostrictive layers arranged alternatingly in layers. The general configurations of these portions are disclosed in, for example, Japanese Patent Application Laid-Open (kokai) No. 2001-320103.

Figure 2:
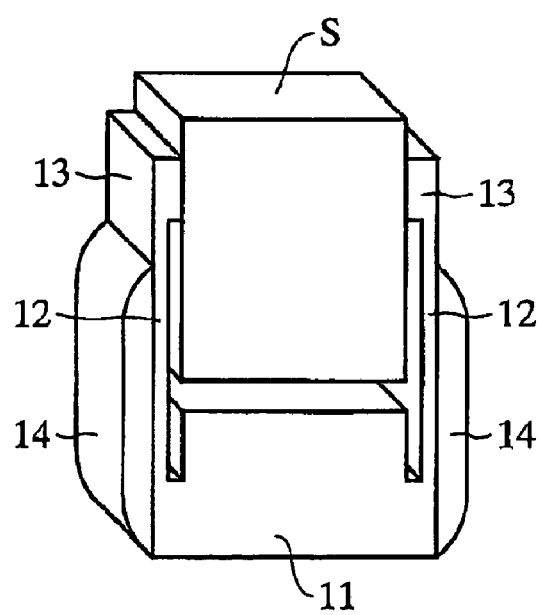
FIG. 2 is a perspective view of the piezoelectric/electrostrictive device of FIG. 1 and an object held by the piezoelectric/electrostrictive device.

As shown in FIG. 2, the piezoelectric/electrostrictive device 10 is used, for example, as an actuator in which an object S is held between the paired holding portions 13, and force generated by the piezoelectric/electrostrictive elements 14 causes the thin-plate portions 12 to be deformed to thereby displace the holding portions 13 for controlling the position of the object S. The object S is a magnetic head, an optical head, a sensitivity-adjusting weight for use in a sensor, or the like.

A portion (also generically called a "substrate portion") that the stationary portion 11, the thin-plate portions 12, and the holding portions 13 constitute is a ceramic laminate, which is formed by firing a laminate of ceramic green sheets as will be described later in detail. Such a monolithic ceramic element does not use an adhesive for joining its portions and is thus almost free from a change in state with time, thereby providing a highly reliable joint and having advantage in terms of attainment of rigidity. The ceramic laminate can be readily manufactured by a ceramic green sheet lamination process, which will be described later.

The entire substrate portion may be formed from ceramic or metal or may assume a hybrid structure in which ceramic and metal are used in combination. Also, the substrate portion may be configured such that ceramic pieces are bonded together by means of an adhesive, such as an organic resin or glass, or such that metallic pieces are joined together by means of brazing, soldering, eutectic bonding, diffusion joining, welding, or the like.

Figure 3:
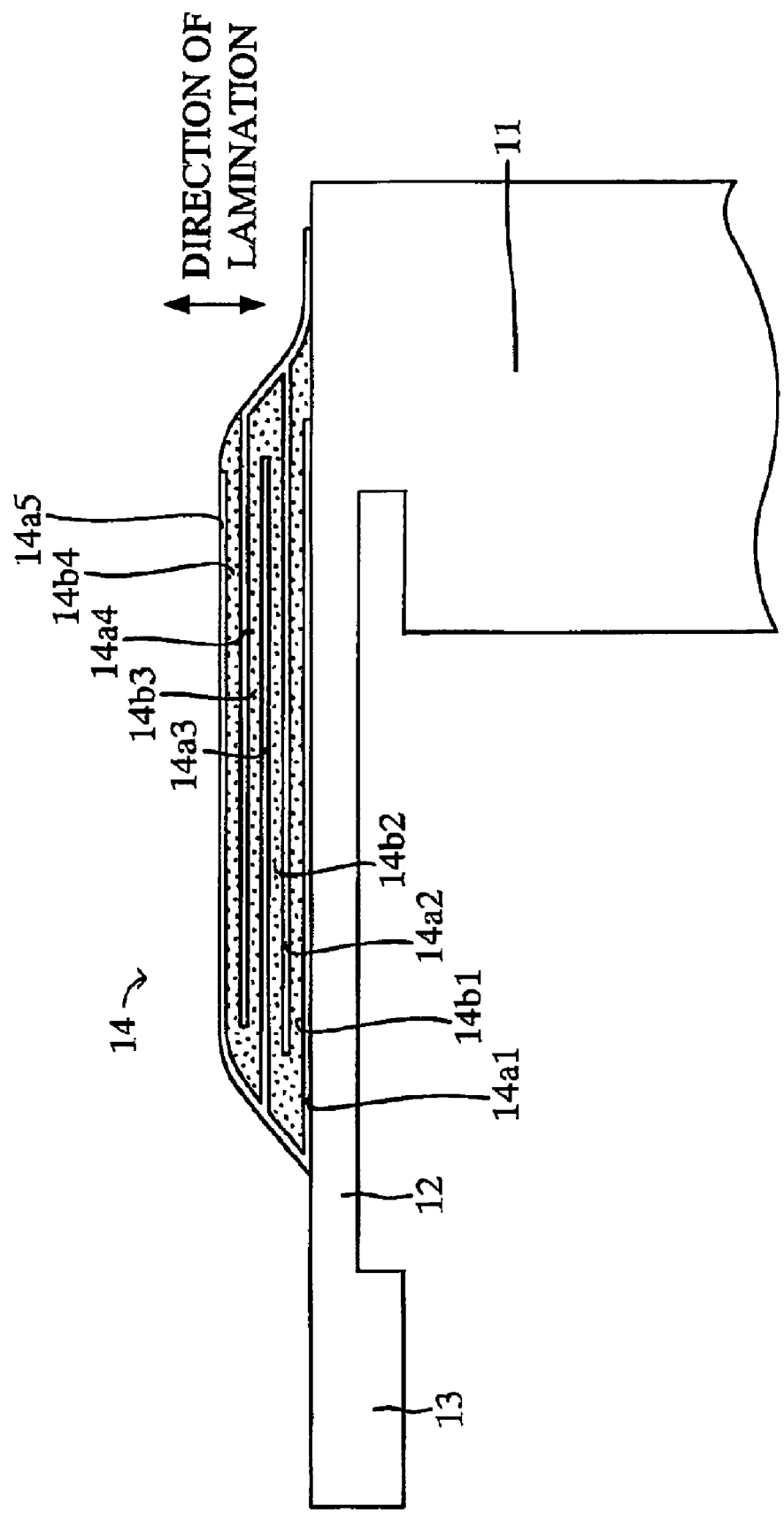
FIG. 3 is an enlarged fragmental front view of the piezoelectric/electrostrictive device of FIG. 1.

As shown in the enlarged view of FIG. 3, the piezoelectric/electrostrictive element 14 is formed on an outer wall surface (outer plane) formed by the stationary portion 11 (a portion of the stationary portion) and the thin-plate portion 12 (a portion of the thin-plate portion), includes a plurality of laminar electrodes and a plurality of piezoelectric/electrostrictive layers, and assumes the form of a laminate in which the laminar electrodes and the piezoelectric/electrostrictive layers are arranged alternatingly in layers. The electrode layers and the piezoelectric/electrostrictive layers are parallel to the plane of the thin-plate portion 12. More specifically, the piezoelectric/electrostrictive element 14 is a laminate in which an electrode 14a1, a piezoelectric/electrostrictive layer 14b1, an electrode 14a2, a piezoelectric/electrostrictive layer 14b2, an electrode 14a3, a piezoelectric/electrostrictive layer 14b3, an electrode 14a4, a piezoelectric/electrostrictive layer 14b4, and an electrode 14a5 are laminated in that order on the outer plane of the thin-plate portion 12. The electrodes 14a1, 14a3, and 14a5 are electrically connected together and are insulated from the electrically connected electrodes 14a2 and 14a4. In other words, the electrically connected electrodes 14a1, 14a3, and 14a5 and the electrically connected electrodes 14a2 and 14a4 are arranged in a shape resembling the teeth of a comb.

The piezoelectric/electrostrictive element 14 is formed integrally with the substrate portion by a film formation process, which will be described later. Alternatively, the piezoelectric/electrostrictive element 14 may be manufactured separately from the substrate portion, followed by a process of joining the piezoelectric/electrostrictive element 14 to the substrate portion by use of an adhesive, such as an organic resin, or by means of glass, brazing, soldering, eutectic bonding, or the like.

The present embodiment shows a multilayered structure including five electrode layers; however, the number of layers is not particularly limited. Generally, as the number of layers increases, a force (drive force) for deforming the thin-plate portions 12 increase, but power consumption also increases. Accordingly, the number of layers may be selected according to, for example, application and the state of use.

A supplementary description of component elements of the piezoelectric/electrostrictive device 10 will next be given below.

The holding portions 13 operate on the basis of displacement of the thin-plate portions 12. Various members are attached to the holding portions 13 according to applications of the piezoelectric/electrostrictive device 10. For example, when the piezoelectric/electrostrictive device 10 is used as an element (displacing element) for displacing an object, particularly when the piezoelectric/electrostrictive 10 is used for positioning or suppressing wringing of a magnetic head of a hard disk drive, a slider having a magnetic head, a magnetic head, a suspension having a slider, or a like member (i.e., a member required to be positioned) may be attached. Also, the shield of an optical shutter or the like may be attached.

As mentioned previously, the stationary portion 11 is adapted to support the thin-plate portions 12 and the holding portions 13. When the piezoelectric/electrostrictive device 10 is used for, for example, positioning the magnetic head of a hard disk drive, the stationary portion 11 is fixedly attached to a carriage arm attached to a VCM (voice coil motor), to a fixture plate attached to the carriage arm, to a suspension, or to a like member. In some cases, unillustrated terminals and other members for driving the piezoelectric/electrostrictive elements 14 may be arranged on the stationary portion 11. The terminals may have a width similar to that of the electrodes or may be narrower or partially narrower than the electrodes.

No particular limitations are imposed on a material for the holding portions 13 and the stationary portion 11, so long as the holding portions 13 and the stationary portion 11 can have rigidity. Generally, use of a ceramic as the material is preferred, since a ceramic green sheet lamination process, which will be described later, can be applied. More specifically, examples of the material include a material that contains, as a main component, zirconia (such as stabilized zirconia or partially stabilized zirconia), alumina, silicon nitride, aluminum nitride, or titanium oxide; and a material that contains a mixture of them as a main component. A material that contains zirconia, particularly stabilized zirconia or partially stabilized zirconia, as a main component is preferred for the piezoelectric/electrostrictive device 10, since mechanical strength and toughness are high. When a metallic material is to be used for manufacturing the holding portions 13 and the stationary portion 11, stainless steel, nickel, or the like is preferred as the metallic material.

As mentioned previously, the thin-plate portions 12 are driven by the piezoelectric/electrostrictive elements 14. The thin-plate portions 12 are thin-plate-like members having flexibility and have a function for converting extension/contraction displacement of the piezoelectric/electrostrictive elements 14 disposed on their surfaces to bending displacement and transmitting the bending displacement to the corresponding holding portions 13. Accordingly, no particular limitations are imposed on the shape of and a material for the thin-plate portions 12, so long as the thin-plate portions 12 are flexible and have such mechanical strength as not to be broken from bending deformation; and the shape and material are selected in view of, for example, response and operability of the holding portions 13.

The thickness Dd (see FIG. 1) of the thin-plate portion 12 is preferably about 2 µm to 100 µm; and the total thickness of the thin-plate portion 12 and the piezoelectric/electrostrictive element 14 is preferably 7 µm to 500 µm. The thickness of each of the electrodes 14a1 to 14a5 is preferably 0.1 µm to 50 µm; and the thickness of each of the piezoelectric/electrostrictive layers 14b1 to 14b4 is preferably 3 µm to 300 µm.

Preferably, as in the case of the holding portions 13 and the stationary portion 11, a ceramic is used to form the thin-plate portions 12. Among ceramics, zirconia, particularly a material that contains stabilized zirconia as a main component, or a material that contains partially stabilized zirconia as a main component, is more preferred because of high mechanical strength exhibited even in thin-walled application, high toughness, and low reactivity with the electrode material of the electrodes 14a1 and the piezoelectric/electrostrictive layers 14b1, which constitute the piezoelectric/electrostrictive element 14.

The thin-plate portions 12 can also be formed from a metallic material that has flexibility and allows bending deformation. Among preferred metallic materials for the thin-plate portions 12, examples of ferrous materials include stainless steels and spring steels, and examples of nonferrous materials include beryllium copper, phosphor bronze, nickel, and nickel—iron alloys.

Preferably, stabilized zirconia or partially stabilized zirconia to be used in the piezoelectric/electrostrictive device 10 is stabilized or partially stabilized in the following manner. At least one or more than one compound selected from the group consisting of yttrium oxide, ytterbium oxide, cerium oxide, calcium oxide, and magnesium oxide is added to zirconia to thereby stabilize or partially stabilize the zirconia.

Each of the compounds is added in the following amount: in the case of yttrium oxide or ytterbium oxide, 1 mol % to 30 mol %, preferably 1.5 mol % to 10 mol %; in the case of cerium oxide, 6 mol % to 50 mol %, preferably 8 mol % to 20 mol %; and in the case of calcium oxide or magnesium oxide, 5 mol % to 40 mol %, preferably 5 mol % to 20 mol %. Particularly, use of yttrium oxide as a stabilizer is preferred. In this case, preferably, yttrium oxide is added in an amount of 1.5 mol % to 10 mol % (more preferably, 2 mol % to 4 mol % when mechanical strength is regarded as important, or 5 mol % to 7 mol % when endurance reliability is regarded as important).

Alumina, silica, transition metal oxide, or the like can be added as a sintering aid or the like in an amount of 0.05 wt % to 20 wt %. In the case where the piezoelectric/electrostrictive elements 14 are formed by means of film formation and monolithic firing, addition of alumina, magnesia, transition metal oxide, or the like is preferred.

In the case where at least one of the stationary portion 11, the thin-plate portion 12, and the holding portion 13 is formed from a ceramic, in order to obtain a ceramic having a high mechanical strength and stable crystal phase, the average crystal grain size of zirconia is preferably set to 0.05 µm to 3 µm, more preferably 0.05 µm to 1 µm. As mentioned previously, the thin-plate portions 12 may be formed from a ceramic similar to (but different from) that used to form the holding portions 13 and the stationary portion 11. However, preferably, the thin-plate portions 12 are formed from a material substantially identical with that of the holding portions 13 and the stationary portion 11 in view of enhancement of the reliability of joint portions, enhancement of the strength of the piezoelectric/electrostrictive device 10, and simplification of a procedure for manufacturing the piezoelectric/electrostrictive device 10.

A piezoelectric/electrostrictive device can use a piezoelectric/electrostrictive element of a unimorph type, a bimorph type, or the like. However, the unimorph type, in which the thin-plate portions 12 and corresponding piezoelectric/electrostrictive elements 14 are combined together, is advantageous in terms of stability of displacement quantity, a reduction in weight, and easy design for avoiding occurrence of opposite orientations between stress generated in the piezoelectric/electrostrictive element and strain associated with deformation of the piezoelectric/electrostrictive device. Therefore, the unimorph type is suited for the piezoelectric/electrostrictive device 10.

Figure 1:
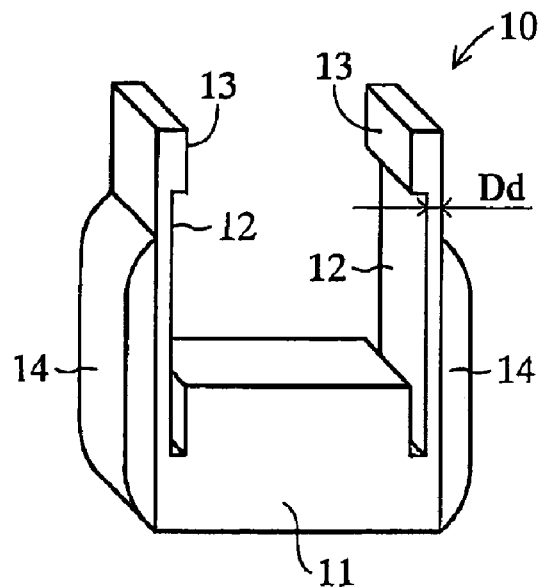
FIG. 1 is a perspective view of a piezoelectric/electrostrictive device according to an embodiment of the present invention.

When, as shown in FIG. 1, the piezoelectric/electrostrictive elements 14 are formed in such a manner that one end of each of the piezoelectric/electrostrictive elements 14 is located on the stationary portion 11 (or the corresponding holding portion 13), whereas the other end is located on the plane of the corresponding thin-plate portion 12, the thin-plate portions 12 can be driven to a greater extent.

Preferably, the piezoelectric/electrostrictive layers 14b1 to 14b4 are formed from a piezoelectric ceramic. Alternatively, the piezoelectric/electrostrictive layers 14b1 to 14b4 may be formed from an electrostrictive ceramic, a ferroelectric ceramic, or an antiferroelectric ceramic. In the case where, in the piezoelectric/electrostrictive device 10, the linearity between the displacement quantity of the holding portions 13 and a drive voltage (or output voltage) is regarded as important, preferably, the piezoelectric/electrostrictive layers 14b1 to 14b4 are formed from a material having low strain hysteresis. Therefore, preferably, the piezoelectric/electrostrictive layers 14b1 to 14b4 are formed from a material whose coercive electric field is 10 kV/mm or less.

A specific material for the piezoelectric/electrostrictive layers 14b1 to 14b4 is a ceramic that contains, singly or in combination, lead zirconate, lead titanate, magnesium lead niobate, nickel lead niobate, zinc lead niobate, manganese lead niobate, antimony lead stannate, manganese lead tungstate, cobalt lead niobate, barium titanate, sodium bismuth titanate, potassium sodium niobate, strontium bismuth tantalate, and the like.

Particularly, a material that contains a predominant amount of lead zirconate, lead titanate, and magnesium lead niobate, or a material that contains a predominant amount of sodium bismuth titanate is preferred as a material for the piezoelectric/electrostrictive layers 14b1 to 14b4, in view of high electromechanical coupling coefficient, high piezoelectric constant, low reactivity with the thin-plate (ceramic) portion 12 during sintering of the piezoelectric/electrostrictive layers 14b1 to 14b4, and obtainment of consistent composition.

Furthermore, there can be used, as a material for the piezoelectric/electrostrictive layers 14b1 to 14b4, a ceramic that contains an oxide of, for example, lanthanum, calcium, strontium, molybdenum, tungsten, barium, niobium, zinc, nickel, manganese, cerium, cadmium, chromium, cobalt, antimony, iron, yttrium, tantalum, lithium, bismuth, or tin. In this case, incorporation of lanthanum or strontium into lead zirconate, lead titanate, or magnesium lead niobate, which is a predominant component, may yield in some cases such an advantage that coercive electric field and a piezoelectric characteristic become adjustable.

Notably, addition of a material prone to vitrify, such as silica, to a material for the piezoelectric/electrostrictive layers 14b1 to 14b4 is desirably avoided. This is because silica or a like material is prone to react with a piezoelectric/electrostrictive material during thermal treatment of the piezoelectric/electrostrictive layers 14b1 to 14b4; as a result, the composition of the piezoelectric/electrostrictive material varies with a resultant deterioration in the piezoelectric property.

Meanwhile, preferably, the electrodes 14a1 to 14a5 of the piezoelectric/electrostrictive elements 14 are formed from a metal that is solid at room temperature and has excellent electrical conductivity. Examples of the metal include aluminum, titanium, chromium, iron, cobalt, nickel, copper, zinc, niobium, molybdenum, ruthenium, palladium, rhodium, silver, tin, tantalum, tungsten, iridium, platinum, gold, lead, and an alloy of these metals. Furthermore, an electrode material can be a cermet material prepared by dispersing in any of the above metals a material identical with that of the piezoelectric/electrostrictive layers 14b1 to 14b4 or that of the thin-plate portions 12.

Selection of an electrode material for use in the piezoelectric/electrostrictive element 14 depends on a method of forming the piezoelectric/electrostrictive layers 14b1 to 14b4. For example, in the case where the electrode 14a1 is formed on the thin-plate portion 12, and then the piezoelectric/electrostrictive layer 14b1 is formed on the electrode 14a1 by means of firing, the electrode 14a1 must be formed of a high-melting-point metal, such as platinum, palladium, a platinum—palladium alloy, or a silver—palladium alloy, that remains intact even when exposed to a firing temperature of the piezoelectric/electrostrictive layer 14b1. This also applies to other electrodes (electrodes 14a2 to 14a4) whose formation is followed by firing of corresponding piezoelectric/electrostrictive layers.

By contrast, in the case of the outermost electrode 14a5 to be formed on the piezoelectric/electrostrictive layer 14b4, the formation of the electrode 14a5 is not followed by firing of a piezoelectric/electrostrictive layer. Thus, the electrode 14a5 can be formed from a low-melting-point metal, such as aluminum, gold, or silver.

Since the laminar electrodes 14a1 to 14a5 possibly cause a reduction in displacement of the piezoelectric/electrostrictive element 14, each of the electrode layers is desirably thin. Particularly, the electrode 14a5, which is formed after the piezoelectric/electrostrictive layer 14b4 is fired, is formed preferably from an organic metal paste, which enables the formation of a dense, very thin film after firing. Examples of the paste include a gold resinate paste, a platinum resinate paste, and a silver resinate paste.

Figure 4:
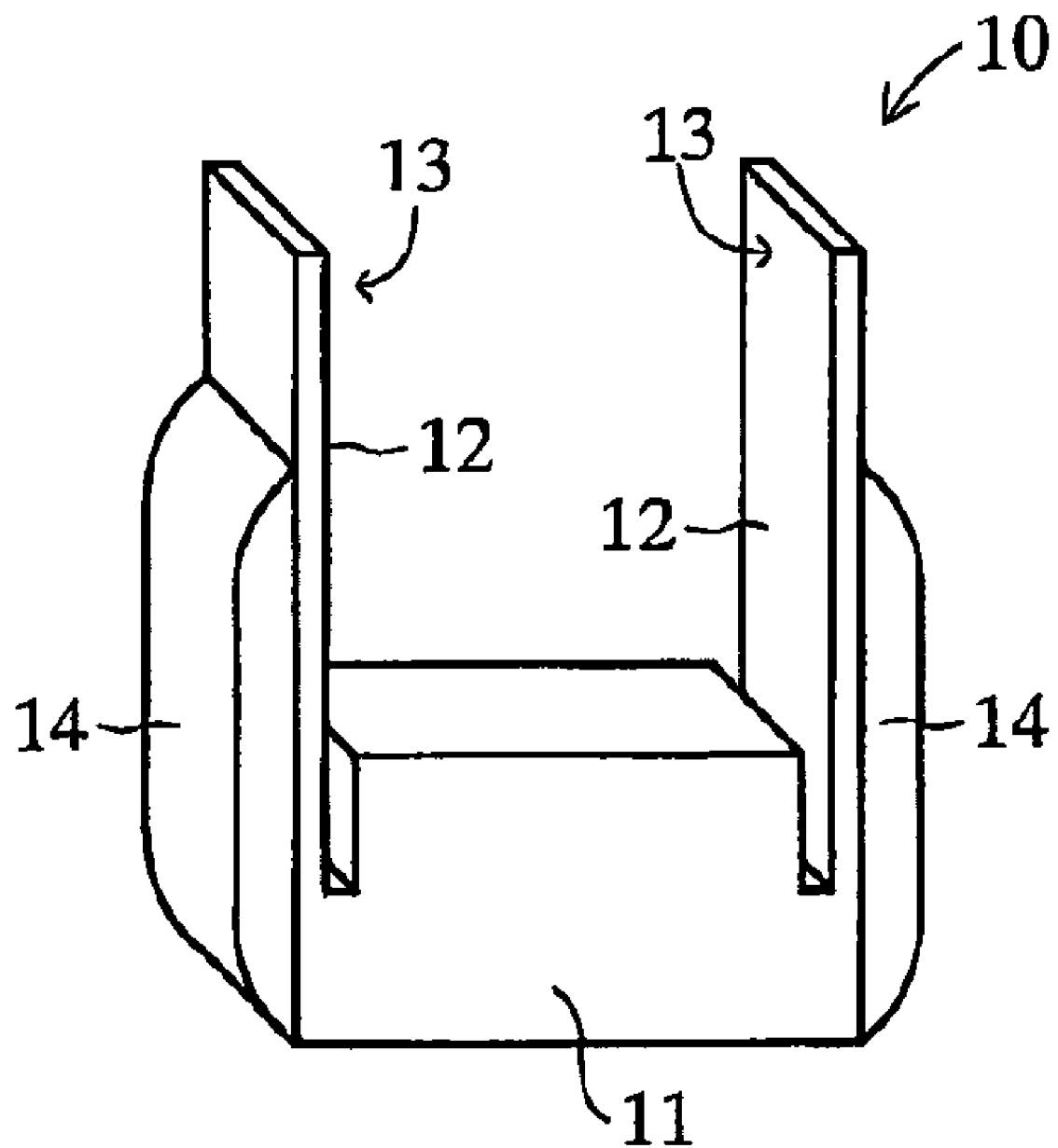
FIG. 4 is a perspective view of a variant of the piezoelectric/electrostrictive device of FIG. 1.

In the piezoelectric/electrostrictive device 10 of FIG. 1, the holding portions 13, which are formed integrally with the corresponding tip end portions of the thin-plate portions 12, have a thickness greater than the thickness Dd of the thin-plate portions 12. However, as shown in FIG. 4, the holding portions 13 may have a thickness substantially equal to that of the thin-plate portions 12. As a result, an object to be held between the holding portions 13 can have a size corresponding to the distance between the thin-plate portions 12. In this case, regions where an adhesive is applied in order to hold the object virtually serves as the corresponding holding portions 13. Furthermore, in this case, a projection for specifying the region where an adhesive is applied may be provided. Desirably, such a projection is formed from the same material as that of the thin-plate portion 12 and integrally with the thin-plate portion 12 by means of monolithic sintering or monolithic molding.

The above-mentioned piezoelectric/electrostrictive device 10 can also be used as an ultrasonic sensor, an acceleration sensor, an angular-velocity sensor, an impact sensor, a mass sensor, or a like sensor. In application to such a sensor, the piezoelectric/electrostrictive device 10 is advantageous in that sensor sensitivity can be readily adjusted by means of appropriately adjusting the size of an object to be held between the opposed holding portions 13 or between the opposed thin-plate portions 12.

Next, a method for manufacturing the above-mentioned piezoelectric/electrostrictive device 10 will be described. Preferably, a substrate portion (which excludes the piezoelectric/electrostrictive elements 14; i.e., which includes the stationary portion 11, the thin-plate portions 12, and the holding portions 13) of the piezoelectric/electrostrictive device 10 is manufactured by a ceramic green sheet lamination process. Meanwhile, preferably, the piezoelectric/electrostrictive elements 14 are manufactured by a film formation process, which is adapted to form a thin film, a thick film, and a like film.

A ceramic green sheet lamination process allows integral formation of members of the substrate portion of the piezoelectric/electrostrictive device 10. Thus, the employment of a ceramic green sheet lamination process allows a joint portion between members to be almost free from a change in state with time, thereby enhancing the reliability of joint portions and securing rigidity. In the case where the substrate portion is formed by laminating metallic plates, the employment of a diffusion joining process allows a joint portion between members to be almost free from a change in state with time, thereby securing the reliability of joint portions, and rigidity.

In the piezoelectric/electrostrictive device 10 of FIG. 1 according to the present embodiment, boundary portions (joint portions) between the thin-plate portions 12 and the stationary portion 11, and boundary portions (joint portions) between the thin-plate portions 12 and the corresponding holding portions 13 serve as fulcrum points for manifestation of displacement. Therefore, the reliability of the joint portions is an important factor that determines the characteristics of the piezoelectric/electrostrictive device 10.

A manufacturing method to be described below features high productivity and excellent formability and thus can yield the piezoelectric/electrostrictive devices 10 having a predetermined shape in a short period of time with good reproducibility.

A first method for manufacturing the piezoelectric/electrostrictive device 10 according to the present embodiment will next be described. In the following description, a laminate obtained by laminating a plurality of ceramic green sheets is defined as a ceramic green sheet laminate 22 (see FIG. 6); and a monolithic body obtained by firing the ceramic green sheet laminate 22 is defined as a ceramic laminate 23 (see FIG. 7).

The manufacturing method is embodied desirably as follows: a single sheet equivalent to a plurality of ceramic laminates of FIG. 7 arranged lengthwise and crosswise is prepared; a laminate corresponding to a plurality of laminates 24 (see FIG. 8), which are formed into the piezoelectric/electrostrictive elements 14, is formed continuously on the surfaces of the sheet in predetermined regions; and the sheet is cut, whereby a plurality of piezoelectric/electrostrictive devices 10 are manufactured in the same process. Furthermore, desirably, two or more piezoelectric/electrostrictive devices 10 are yielded in association with a single window (including Wd1 and the like shown in FIG. 5). It should be noted that in order to simplify description, the following description discusses a method for obtaining a single piezoelectric/electrostrictive device 10 from a ceramic laminate by cutting the ceramic laminate.

First, a binder, a solvent, a dispersant, a plasticizer, and the like are mixed with a ceramic powder of zirconia or the like, thereby preparing a slurry. The slurry is defoamed. By use of the defoamed slurry, a rectangular ceramic green sheet having a predetermined thickness is formed by a reverse roll coater process, a doctor blade process, or a like process.

Figure 5:
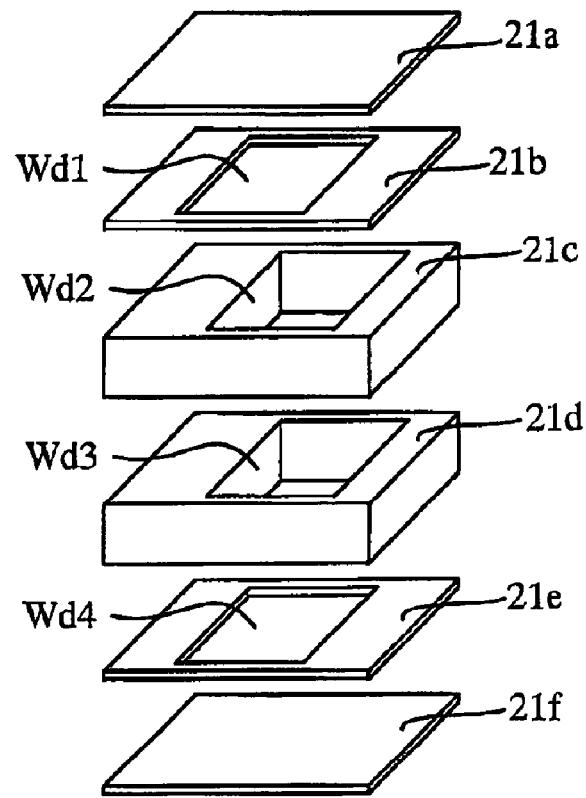
FIG. 5 is a perspective view of ceramic green sheets to be laminated in a first method for manufacturing a piezoelectric/electrostrictive device according to the present invention.

Next, as shown in FIG. 5, a plurality of ceramic green sheets 21a to 21f are formed from the above-prepared ceramic green sheet by blanking with a die, laser machining, or like machining.

In the example of FIG. 5, rectangular windows Wd1 to Wd4 are formed in the ceramic green sheets 21b to 21e, respectively. The windows Wd1 and Wd4 have substantially the same shape, and the windows Wd2 and Wd3 have substantially the same shape. Each of the ceramic green sheets 21a and 21f includes a portion that is formed into the thin-plate portion 12. Each of the ceramic green sheets 21b and 21e includes a portion that is formed into the holding portion 13. Notably, the number of ceramic green sheets is given merely as an example. In the illustrated example, the ceramic green sheets 21c and 21d may be replaced with a single green sheet having a predetermined thickness or with a plurality of ceramic green sheets to be laminated so as to obtain the predetermined thickness or with a green sheet laminate having the predetermined thickness.

Figure 6:
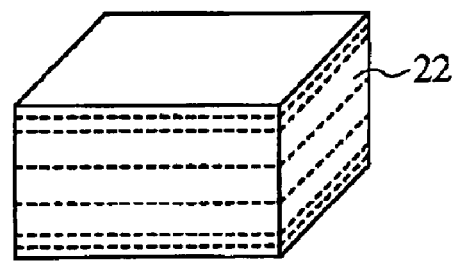
FIG. 6 is a perspective view of a ceramic green sheet laminate formed by laminating and compression-bonding the ceramic green sheets of FIG. 5.

Subsequently, as shown in FIG. 6, the ceramic green sheets 21a to 21f are laminated and compression-bonded to thereby form the ceramic green sheet laminate 22. Next, the ceramic green sheet laminate is fired to thereby form the ceramic laminate 23 shown in FIG. 7.

No particular limitations are imposed on the number and order of compression-bonding operations for forming the ceramic green sheet laminate 22 (for monolithic lamination). In the case where a portion to which pressure is not sufficiently transmitted by uniaxial application of pressure (application of pressure in a single direction) exists, desirably, compression bonding is repeated a plurality of times, or impregnation with a pressure-transmitting substance is employed in compression bonding. Also, for example, the shape of the windows Wd1 to Wd4 and the number and thickness of ceramic green sheets can be determined as appropriate according to the structure and function of the piezoelectric/electrostrictive device 10 to be manufactured.

When the above compression bonding for monolithic lamination is performed while heat is applied, a more reliable state of lamination is obtained. When a paste, a slurry, or the like that contains a predominant amount of a ceramic powder and a binder and serves as a bonding aid layer is applied to ceramic green sheets by means of coating or printing before the ceramic green sheets are compression-bonded, the state of bonding at the interface between the ceramic green sheets can be enhanced. In this case, preferably, the ceramic powder to be used as a bonding aid has a composition identical with or similar to a ceramic used in the ceramic green sheets 21a to 21f in view of the reliability of bonding. Furthermore, in the case where the ceramic green sheets 21a and 21f are thin, the use of a plastic film (particularly, a polyethylene terephthalate film coated with a silicone-base parting agent) is preferred in handling the ceramic green sheets 21a and 21f. When the windows Wd1 and Wd4 and the like are to be formed in relatively thin sheets, such as the ceramic green sheets 21b and 21e, each of these sheets may be attached to the above-mentioned plastic film before a process for forming the windows Wd1 and Wd4 and the like is performed.

Figure 8:
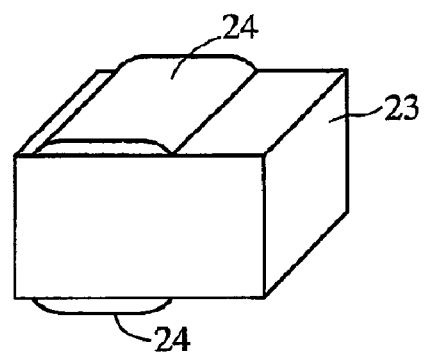
FIG. 8 is a perspective view of the ceramic laminate of FIG. 7 on which piezoelectric/electrostrictive laminates are formed.

Next, as shown in FIG. 8, the piezoelectric/electrostrictive laminates 24 are formed on the corresponding opposite sides of the ceramic laminate 23; i.e., on the corresponding surfaces of the fired ceramic green sheets 21a and 21f. Examples of methods for forming the piezoelectric/electrostrictive laminates 24 include thick-film formation processes, such as a screen printing process, a dipping process, a coating process, and an electrophoresis process; and thin-film formation processes, such as an ion beam process, a sputtering process, a vacuum deposition process, an ion plating process, a chemical vapor deposition (CVD) process, and a plating process.

The use of such a film formation process in formation of the piezoelectric/electrostrictive laminates 24 allows the piezoelectric/electrostrictive laminates 24 and the thin-plate portions 12 to be monolithically bonded (disposed), thereby securing reliability and reproducibility and facilitating integration.

In this case, more preferably, a thick-film formation process is used for forming the piezoelectric/electrostrictive laminates 24. A thick-film formation process allows, in film formation, the use of a paste, a slurry, a suspension, an emulsion, a sol, or the like that contains a predominant amount of piezoelectric ceramic particles or powder having an average particle size of 0.01 μm to 5 μm, preferably 0.05 μm to 3 μm. The piezoelectric/electrostrictive laminates 24 obtained by firing the thus-formed films exhibit a good piezoelectric/electrostrictive characteristic.

An electrophoresis process has such an advantage that a film can be formed with high density and high shape accuracy. A screen printing process can simultaneously perform control of film thickness and pattern formation and thus can simplify a manufacturing process.

An example method for forming the ceramic laminate 23 and the piezoelectric/electrostrictive laminates 24 will be described in detail. First, the ceramic green sheet laminate 22 is monolithically fired at a temperature of 1,200° C. to 1,600° C., thereby yielding the ceramic laminate 23 shown in FIG. 7. Subsequently, as shown in FIG. 3, the electrodes 14a1 are printed on the corresponding opposite sides of the ceramic laminate 23 at a predetermined position, followed by firing. Next, the piezoelectric/electrostrictive layers 14b1 are printed and fired. The electrodes 14a2 are printed on the corresponding piezoelectric/electrostrictive layers 14b1, followed by firing. Such an operation is repeated a predetermined number of times to thereby form the piezoelectric/electrostrictive laminates 24. Subsequently, a terminal (not shown) for electrically connecting the electrodes 14a1, 14a3, and 14a5 to a drive circuit, and a terminal (not shown) for electrically connecting the electrodes 14a2 and 14a4 to the drive circuit are printed and fired.

Alternatively, the piezoelectric/electrostrictive laminates 24 may be formed as follows. The bottom electrode 14a1 is printed and fired. Subsequently, the piezoelectric/electrostrictive layer 14b1 and the electrode 14a2 are printed and are then simultaneously fired. Similarly, a process in which a single piezoelectric/electrostrictive layer and a single electrode are printed and then simultaneously fired is repeated a predetermined number of times.

In this case, for example, the electrodes 14a1, 14a2, 14a3, and 14a4 are formed from a material that contains a predominant amount of platinum (Pt); the piezoelectric/electrostrictive layers 14b1 to 14b4 are formed from a material that contains a predominant amount of lead zirconate titanate (PZT); the electrode 14a5 is formed from gold (Au); and the terminals are formed from silver (Ag). In this manner, materials are selected in such a manner that their firing temperature lowers in the ascending order of lamination. As a result, at a certain firing stage, a material(s) that has been fired is free from re-sintering, thereby avoiding occurrence of a problem, such as the exfoliation or cohesion of an electrode material.

The selection of appropriate materials allows the members of the piezoelectric/electrostrictive laminates 24 and the terminals to be sequentially printed and then monolithically fired in a single firing operation. Also, the piezoelectric/electrostrictive laminate 24 may be formed as follows: a firing temperature for the outermost piezoelectric/electrostrictive layer 14b4 is set higher than that for the piezoelectric/electrostrictive layers 14b1 to 14b3, so as to finally bring the piezoelectric/electrostrictive layers 14b1 to 14b4 into the same sintered state.

The members of the piezoelectric/electrostrictive laminates 24 and the terminals may be formed by a thin-film formation process, such as a sputtering process or a vapor deposition process. In this case, heat treatment is not necessarily required.

The following simultaneous firing process may be employed. The piezoelectric/electrostrictive laminates 24 are formed on the corresponding opposite sides of the ceramic green sheet laminate 22; i.e., on the corresponding surfaces of the ceramic green sheets 21a and 21f. Subsequently, the ceramic green sheet laminate 22 and the piezoelectric/electrostrictive laminates 24 are simultaneously fired.

In an example method for simultaneously firing the piezoelectric/electrostrictive laminates 24 and the ceramic green sheet laminate 22, precursors of the piezoelectric/electrostrictive laminates 24 are formed by a tape formation process using a slurry material, or a like process; the precursors of the piezoelectric/electrostrictive laminates 24 are laminated on the corresponding opposite sides of the ceramic green sheet laminate 22 by thermo-compression bonding or the like; and subsequently the precursors and the ceramic green sheet laminate 22 are simultaneously fired. However, in this method, the electrodes 14a1 must be formed beforehand on the corresponding opposite sides of the ceramic green sheet laminate 22 and/or on the corresponding piezoelectric/electrostrictive laminates 24 by use of any film formation process mentioned above.

In another method, the electrodes 14a1 to 14a5 and the piezoelectric/electrostrictive layers 14b1 to 14b4, which are component layers of the piezoelectric/electrostrictive laminates 24, are screen-printed at least on those portions of the ceramic green sheet laminate 22 which are finally formed into the corresponding thin-plate portions 12; and the component layers and the ceramic green sheet laminate 22 are simultaneously fired.

A firing temperature for a component layer of the piezoelectric/electrostrictive laminates 24 depends on the material of the component layer, but is generally 500° C. to 1,500° C. A preferred firing temperature for the piezoelectric/electrostrictive layers 14b1 to 14b4 is 1,000° C. to 1,400° C. In this case, preferably, in order to control the composition of the piezoelectric/electrostrictive layers 14b1 to 14b4, sintering is performed in such a state that evaporation of the material of the piezoelectric/electrostrictive layers 14b1 to 14b4 is controlled (for example, In the presence of an evaporation source). In the case where the piezoelectric/electrostrictive layers 14b1 to 14b4 and the ceramic green sheet laminate 22 are simultaneously fired, their firing conditions must be compatible with each other. The piezoelectric/electrostrictive laminates 24 are not necessarily formed on the corresponding opposite sides of the ceramic laminate 23 or the ceramic green sheet laminate 22, but may be formed only on a single side of the ceramic laminate 23 or the ceramic green sheet laminate 22.

Next, unnecessary portions are cut away from the ceramic laminate 23 on which the piezoelectric/electrostrictive laminates 24 are formed as described above. Specifically, the ceramic laminate 23 is cut along cutting lines (broken lines) C1 to C4 shown in FIG. 9. Cutting can be performed by mechanical machining, such as wire sawing or dicing, as well as laser machining, such as YAG laser machining or excimer laser machining, or electron beam machining.

Among the above cutting methods, dicing is undesirable for the following reason. Cutting the ceramic laminate 23 and the piezoelectric/electrostrictive laminates 24 along the cutting lines (broken lines) C3 and C4 of FIG. 9 includes cutting of the components of the piezoelectric/electrostrictive laminates 24; i.e., cutting of piezoelectric/electrostrictive layers which are relatively low in strength and fragile, and a metal which is ductile. Thus, dicing, which imposes a large machining load on an object to be cut (hereinafter, a "monolithic body including the ceramic laminate 23 and the piezoelectric/electrostrictive laminate 24," which partially constitutes the piezoelectric/electrostrictive device 10, is also referred to as an "object to be cut"), is undesirable. Machining of another type whose machining load to be imposed on an object to be cut is small is desirable. Particularly, wire sawing is suited for such cutting, since wire sawing is suited for simultaneously forming a plurality of piezoelectric/electrostrictive devices 10 by means of simultaneous cutting and is small in machining load.

In this case, the above-mentioned cutting (wire sawing) is performed as follows. A wire saw WS, which serves as a wire member, is caused to advance (move) in a direction parallel to a layer plane along the cutting lines C3 and C4 while the wire saw WS is caused to reciprocate in a direction substantially parallel to the direction of lamination of the laminar electrodes 14a1 to 14a5 and the piezoelectric/electrostrictive layers 14b1 to 14b4 of the piezoelectric/electrostrictive laminates 24 as represented by the arrow AR1 of FIG. 9; in other words, in a direction substantially perpendicular to the layer planes of the electrodes 14a1 to 14a5 and the piezoelectric/electrostrictive layers 14b1 to 14b4 (in a direction substantially perpendicular to boundary surfaces between laminar electrodes and piezoelectric/electrostrictive layers; therefore, in a direction substantially perpendicular to planes of the fired ceramic green sheets 21a and 21f) and is held substantially parallel to the direction of lamination.

Desirably, wire sawing is performed in such a manner that the hole composed of the window d1 and other windows is filled with a filler, such as wax or resin, so as to prevent vibration of the thin-plate portions (portions corresponding to the ceramic green sheets 21a and 21f). After wire sawing, the filler may be removed by dissolution with an appropriate solvent or may be burned out. Desirably, before wire sawing is performed, an organic resin, or a paste or the like composed of an organic resin and a ceramic is applied to the surfaces of the laminates 24, which are formed into the piezoelectric/electrostrictive elements 14, followed by drying and curing to thereby form a protective film (protective layer). The thickness of the protective film is desirably 1 μm to 500 μm, more desirably 20 μm to 100 μm. The protective film can be formed by printing, spraying, or the like. Desirably, the thickness of the outermost electrode of the piezoelectric/electrostrictive element is increased so that the electrode layer serves as the protective layer to cope with wire sawing.

The above-mentioned object to be cut is not directly mounted to a wire-sawing stage. Generally, the object to be cut is bonded to a jig by use of wax, an adhesive, or the like, and the jig is mounted to the wire-sawing stage. Desirably, a cut base (a member to be cut together with the object to be cut), such as a plate of glass or silicon wafer, a plate of an organic resin (PET, PC, PE, PP, or the like), or film or a like thin plate of such an organic resin, is interposed between the jig and the object to be cut. In this case, desirably, an adhesive used for bonding the object to be cut and the cut base, and an adhesive used for bonding the cut base and the jig differ in mutual solubility with respect to respectively predetermined solvents.

Selection of such adhesives can prevent a solvent used for separating the cut base and the jig from affecting a bond between the cut base and a cut object. Thus, after the cut base and the jig are separated from each other, the cut object can be handled while being bonded to the cut base. For example, when abrasive grains which adhere, during wire sawing, to the object to be cut are to be cleaned off, an operation of setting (placing) the cut object in a cleaning jig is facilitated by employment of the following practice: the cut object bonded to the cut base is placed in the cleaning jig at a predetermined position and then cleaned, and subsequently the cut base and the cut object are separated from each other in the cleaning jig.

Figure 32:
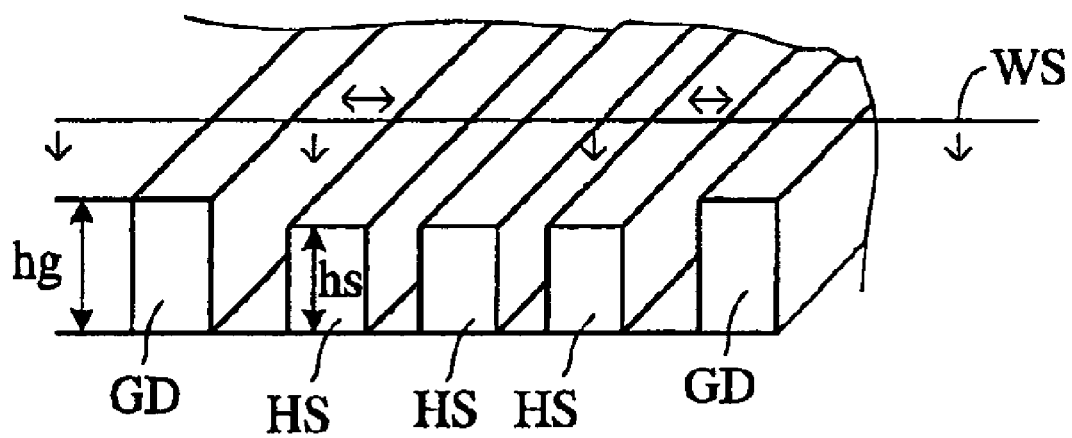
FIG. 32 is a view showing a cutting step for cutting the ceramic laminates and the piezoelectric/electrostrictive laminates shown in FIG. 8.

Desirably, in order to stabilize the reciprocating motion of a wire, wire sawing is performed as follows. As shown in FIG. 32, at least a pair of guides GD are disposed in such a manner that objects HS to be cut are held between the guides GD. First, a wire WS cuts into the guides GD, whereby the reciprocating motion of the wire WS is stabilized. Subsequently, the wire WS begins to cut the objects HS to be cut. Desirably, a material for the guide GD is a ceramic, such as alumina, zirconia, ferrite, or glass, an aforementioned metallic material, carbon, graphite, monocrystalline silicon, or the like. Needless to say, the height hg of the guide GD is slightly greater than the height hs of the object HS to be cut. The differential height (hg−hs) between the guide GD and the object HS to be cut is desirably one time the diameter of the wire or more, more desirably three times or more. However, since the differential height between the guide and the object to be cut must be reduced in view of machining, more desirably, the differential height is 10 times the wire diameter or less.

In order to enhance ejection (taking out) of abrasive grains, the thickness of the guide as measured in the direction of the reciprocating movement of the wire is desirably small; specifically, 5 mm or less, more desirably 2 mm or less. Desirably, the guide has a small thickness as measured in the direction of the reciprocating movement of the wire and high rigidity and is easy to cut (highly easy to grind) by abrasive grains. Specifically, use of carbon is desirable. Alternatively, selection may be made from among iron, any other metal, SUS, glass, alumina, and zirconia in that order while considering machinability with respect to the object to be cut.

Desirably, when the wire is moved away from the cut object after completion of wire sawing, the wire is caused to continue reciprocating so as to maintain a state of ejection of abrasive grains as during cutting. Also, the wire is preferably moved away from the cut object after the reciprocating speed is increased from that during cutting. This yields the effect of smoothening the machined lateral end surfaces of the cut object by means of rubbing with the wire and abrasive grains. An abrasive material (grains) for use with the wire saw is appropriately selected from SiC, $Al_2O_3$, $ZrO_2$, diamond, and the like and has an average grain size of 1 μm to 30 μm, desirably 1 μm to 5 μm.

Figure 9:
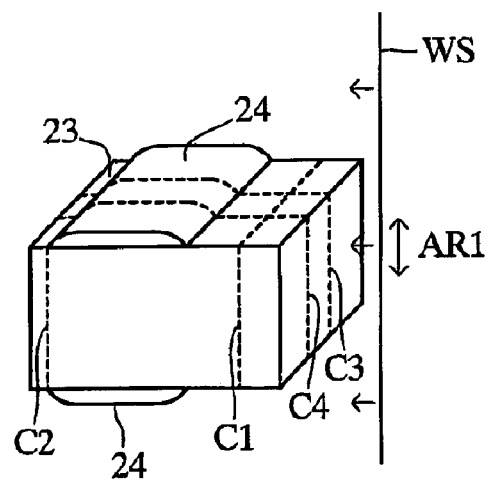
FIG. 9 is a view showing a cutting step for cutting the ceramic laminate and the piezoelectric/electrostrictive laminates shown in FIG. 8.

During wire sawing, the wire (wire saw) WS has a reciprocating speed (in the reciprocating direction represented by the arrow AR1 of FIG. 9) of 10 m/min to 1,500 m/min, desirably 100 m/min to 600 m/min. The feed rate of the wire (in a direction perpendicular to the reciprocating direction represented by the arrow AR1 of FIG. 9; i.e., in a cutting advancement direction) is 0.5 mm/min, desirably 0.1 mm/min or less. Desirably, the tension of the wire WS is 1 N to 20 N.

Wire sawing may be performed as follows: instead of feeding the wire WS at a constant rate after the wire WS comes into contact with the object HS to be cut and begins to cut the object HS, at the beginning of machining of the object HS, an operation of temporarily suspending the feed of the wire WS or reversing the feed, and resuming the feed is repeated, so that machining in the direction of feed proceeds gradually. In the case where feed is temporarily suspended, the machining in the direction of feed is desirably performed by repeating an operation of feeding the wire WS from the machining start point by a quantity equal to or greater than an average grain size of abrasive material and equal to or less than ½, preferably ¼, of the diameter of the wire WS, and then suspending the feed of the wire WS. In the case where feed is reversed, the feed of the wire WS is reversed by a quantity equal to or greater than the average grain size of abrasive material, preferably five times the average grain size. In this case, the reverse rate may be greater than the feed rate. These practices can reduce a machining load imposed on a surface to be machined and can improve the finish of the machined surface.

During wire sawing, abrasive grains or foreign matter, such as adhesive, adheres to the object to be cut. Such an adhering substance is desirably removed from the cut object by means of cleaning. At that time, if foreign matter is allowed to evaporate and solidify, removal of foreign matter becomes difficult. Therefore, desirably, foreign matter is cleaned off while the foreign matter is caused not to evaporate and dry. When such cleaning is to be performed, a solvent that is used for suspending abrasive grains in order to spray the abrasive grains on the object to be cut during wiring sawing is used at an initial stage of the cleaning.

In contrast to cutting along the cutting lines C3 and C4, in which a complex including ceramics, electrodes, and piezoelectric/electrostrictive layers which differ in mechanical characteristics (different physical properties in relation to cutting) is cut, cutting a portion of ceramics of uniform or similar mechanical characteristics can be performed by wire sawing or any other machining method. For example, preferably, dicing is employed for cutting a portion to be formed into the holding portions 13, and a portion to be formed into the stationary portion 11, in a direction perpendicular to the cutting lines C3 and C4. By the above-described method, the piezoelectric/electrostrictive device 10 of FIG. 1 is manufactured.

Figure 10:
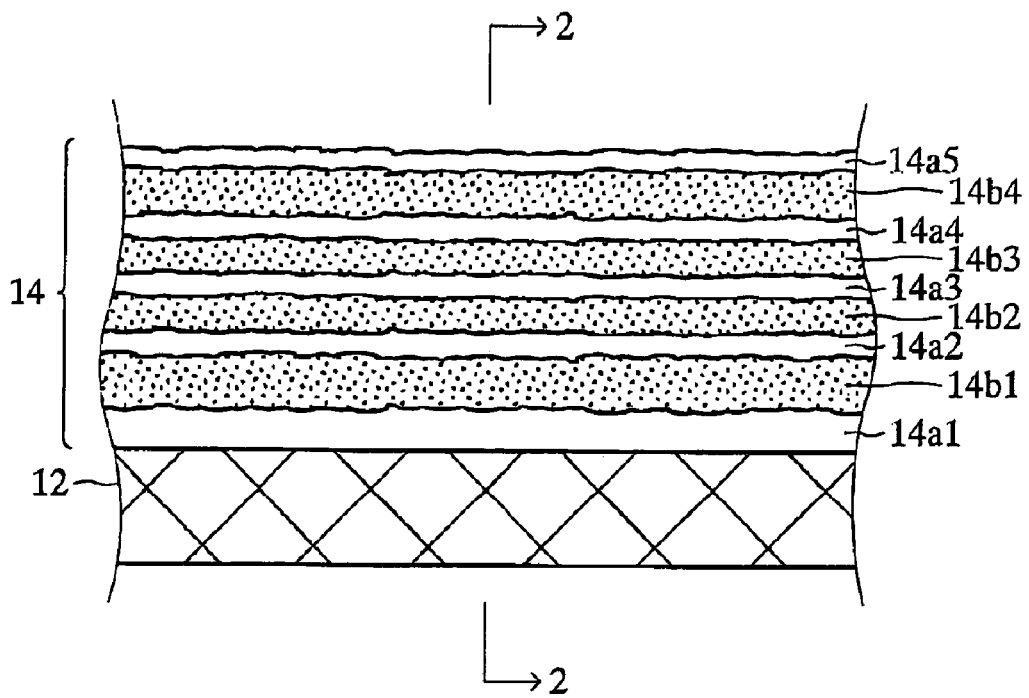
FIG. 10 is a fragmentary front view of a lateral end surface (cut surface) of the piezoelectric/electrostrictive element and the thin-plate portion shown in FIG. 1.

According to the above-describe manufacturing method, the wire saw WS is caused to advance in a direction parallel to the layer planes of the piezoelectric/electrostrictive laminates 24 and in a plane perpendicular to the layer planes while the wire saw WS is caused to reciprocate in the direction of lamination of the piezoelectric/electrostrictive laminates 24 and is held parallel to the direction of lamination, whereby the piezoelectric/electrostrictive laminates 24 are cut to thereby yield the final shape of the piezoelectric/electrostrictive element 14. As shown in FIG. 10, a front view of the lateral end surface (cut surface) of the piezoelectric/electrostrictive element 14 and the thin-plate portion 12, and in FIG. 11, a sectional view taken along line 2—2 of FIG. 10 and showing the piezoelectric/electrostrictive element 14 and the thin-plate portion 12, a portion of, for example, the electrode 14$a$2 which portion forms the lateral end surface extends onto the lateral end surfaces of the piezoelectric/electrostrictive layers 14$b$1 and 14$b$2 between which the electrode 14$a$2 is sandwiched, in such a manner as to partially cover the lateral end surfaces of the piezoelectric/electrostrictive layers 14$b$1 and 14$b$2. That is, a portion of each of the electrodes 14$a$1 to 14$a$5 of the piezoelectric/electrostrictive element 14, which portion forms the corresponding lateral end surface, extends onto the lateral end surfaces of the piezoelectric/electrostrictive layers between which the electrode is sandwiched, in such a manner as to partially cover the lateral end surfaces of the piezoelectric/electrostrictive layers.

Figure 11:
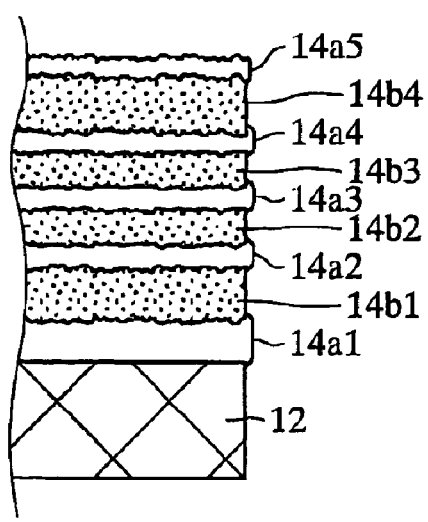
FIG. 11 is a fragmentary, sectional view taken along line 2—2 of FIG. 10 and showing the piezoelectric/electrostrictive element and the thin-plate portion.
Figure 12:
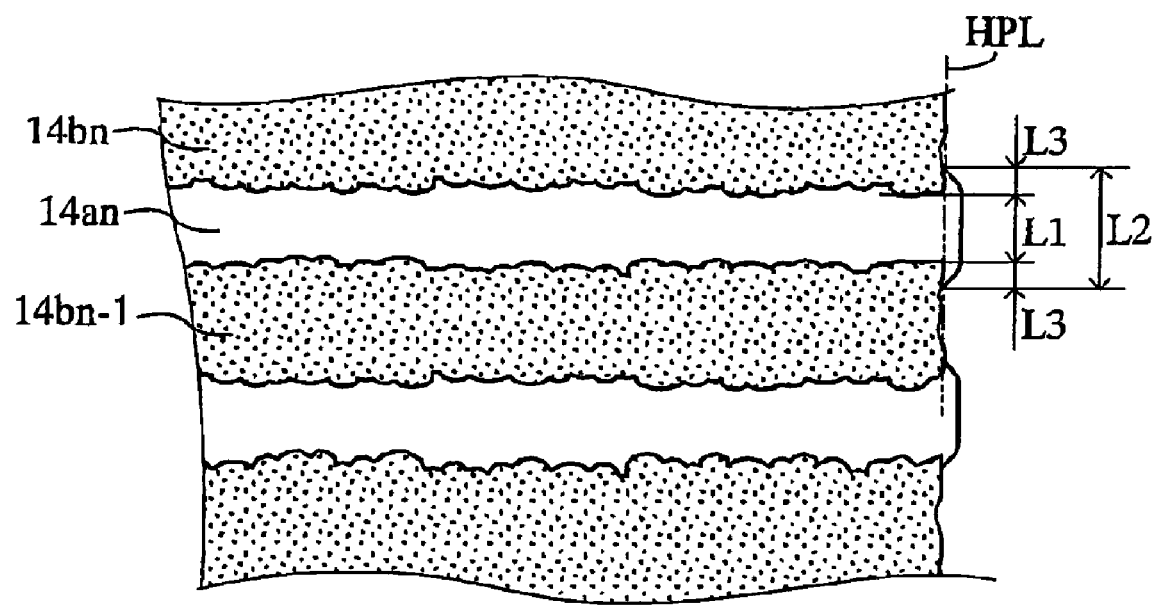
FIG. 12 is an enlarged fragmentary view of FIG. 11.

As a result, as shown in FIG. 12, an enlarged view of FIG. 11, "on the lateral end surface of the piezoelectric/electrostrictive element 14," the length L2 of "the lateral end surface of the electrode 14$an$ (n:1 to 5) as measured in the direction of lamination of the piezoelectric/electrostrictive layers 14$bn$ and the electrode 14$an$" is smaller than five times the length L1 of the electrode as measured in the direction of lamination and on the imaginary plane HPL defined by the lateral end surfaces of the piezoelectric/electrostrictive layers 14$bn$ and 14$bn$–1. Accordingly, on the lateral end surface of the piezoelectric/electrostrictive element 14, the distance between adjacent electrodes is increased, thereby reducing the susceptibility of adjacent electrodes to short circuit in the course of manufacture or use.

Also, the piezoelectric/electrostrictive device 10 is such that a ratio of L3/L1 satisfies 0<L3/L1<2 (i.e., L3/L1 is greater than 0 and smaller than 2), where L3 is the length of the longer of parts of a lateral-end-surface-forming portion of each electrode 14$an$ which portion forms the corresponding lateral end surface of the electrode, the parts of the portion covering the corresponding lateral end surfaces of the piezoelectric/electrostrictive layers 14$bn$ and 14$bn$–1 between which the electrode 14$an$ is sandwiched, the length being measured in the direction of lamination of the piezoelectric/electrostrictive layers and the electrode; and L1 is the thickness, as measured in the direction of lamination, of the lateral-end-surface-forming portion of the electrode after removal of the parts covering the corresponding lateral end surfaces of the piezoelectric/electrostrictive layers from the lateral-end-surface-forming portion of the electrode.

The piezoelectric/electrostrictive device 10 in which the relation 0<L3/L1<2 is satisfied is highly unsusceptible to a failure to exhibit sufficient insulating performance at the stage of completion of manufacture thereof and is highly unlikely to impair its insulating performance in the course of use. Additionally, when voltage is applied to the electrodes, electric field Intensity as measured on the lateral end surfaces of the piezoelectric/electrostrictive layers becomes higher than internally measured electric field intensity, so that compression stress can be effectively generated on the lateral end surfaces of the piezoelectric/electrostrictive layers. As a result, the strength of the piezoelectric/electrostrictive device 10 can be enhanced.

Figure 13:
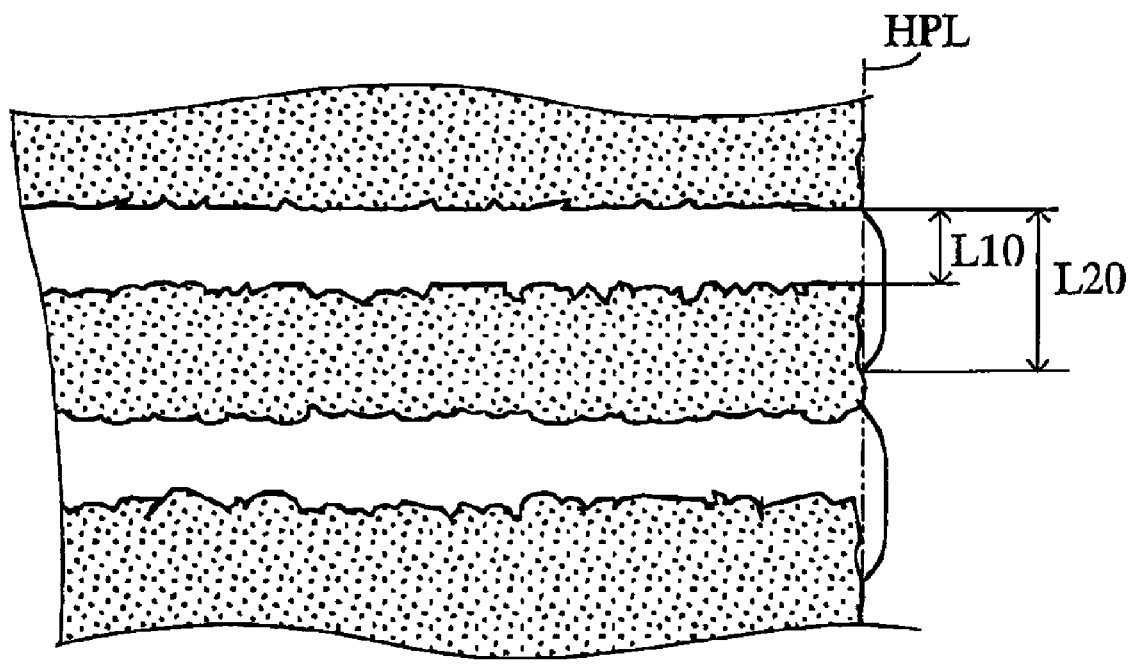
FIG. 13 is an enlarged fragmentary front view of a lateral end surface (cut surface) of a piezoelectric/electrostrictive element manufactured by a method other than that of the present invention.

In a piezoelectric/electrostrictive device manufactured by a method that does not comply with the present invention, as shown in FIG. 13 equivalent to FIG. 12, in some cases, "on the lateral end surface of the piezoelectric/electrostrictive element 14," the length L20 of a "portion of the electrode 14$an$ (n:1 to 5) forming the lateral end surface as measured in the direction of lamination of the piezoelectric/electrostrictive layers 14$bn$ and the electrode 14$an$" becomes greater than five times the length L10 of the electrode as measured in the direction of lamination and on the imaginary plane HPL defined by the lateral end surfaces of the piezoelectric/electrostrictive layers 14$bn$ and 14$bn$–1, indicating a possible failure to provide sufficient reliability.

Next, a second method for manufacturing the piezoelectric/electrostrictive device 10 according to the present invention will be described. First, a binder, a solvent, a dispersant, a plasticizer, and the like are mixed with a ceramic powder of zirconia or the like, thereby preparing a slurry. The slurry is defoamed. By use of the defoamed slurry, a rectangular ceramic green sheet having a predetermined thickness is formed by a reverse roll coater process, a doctor blade process, or a like process.

Figure 14:
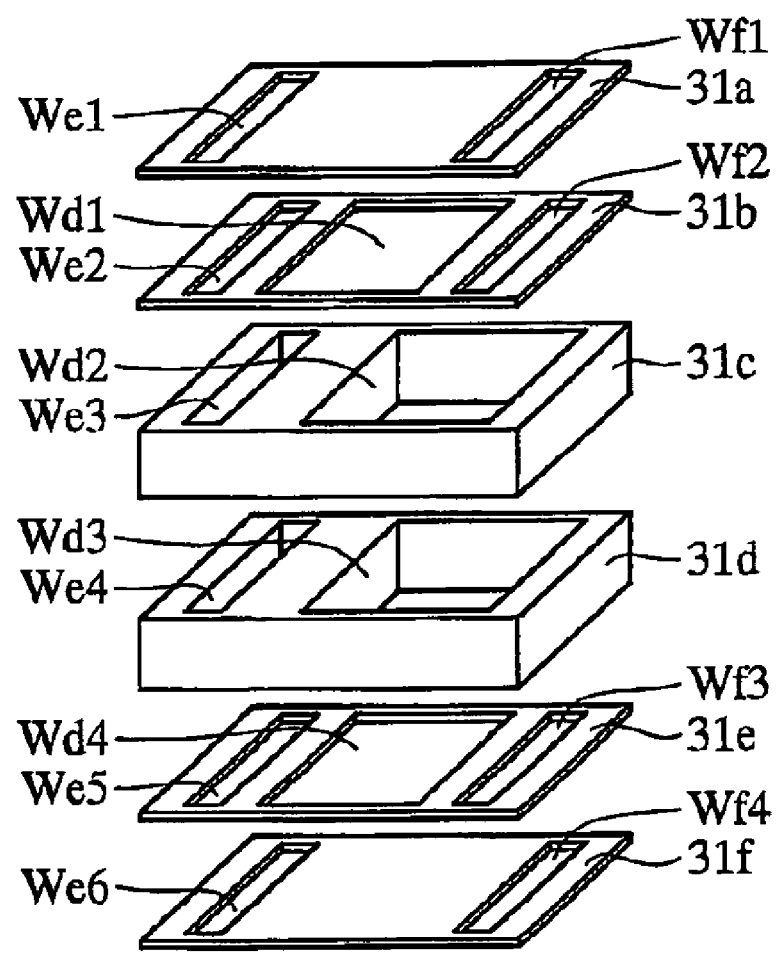
FIG. 14 is a perspective view of ceramic green sheets to be laminated in a second method for manufacturing a piezoelectric/electrostrictive device according to the present invention.

Next, as shown in FIG. 14, a plurality of ceramic green sheets 31$a$ to 31$f$ are formed from the above-prepared ceramic green sheet by blanking with a die, laser machining, or like machining. Particularly, blanking with a die is most preferred in terms of a formed shape, the condition of a machined surface, and a machining speed (machining quantity).

In the example shown in FIG. 14, as in the case of the ceramic green sheets 21$b$ to 21$e$ appearing in the previously described first manufacturing method, the rectangular windows Wd1 to Wd4 are formed in ceramic green sheets 31$b$ to 31$e$, respectively. The windows Wd1 and Wd4 have substantially the same shape, and the windows Wd2 and Wd3 have substantially the same shape.

Windows We1 to We6 of substantially the same shape are formed in the ceramic green sheets 31$a$ to 31$f$, respectively. Windows Wf1 to Wf4 of substantially the same shape are formed in the ceramic green sheets 31$a$, 31$b$, 31$e$, and 31$f$, respectively. Each of the ceramic green sheets 31$a$ and 31$f$ includes a portion that is formed into the thin-plate portion 12. Each of the ceramic green sheets 31$b$ and 31$e$ includes a portion that is formed into the holding portion 13. Also, in this case, the number of ceramic green sheets is given merely as an example. In the illustrated example, each of the ceramic green sheets 31$c$ and 31$d$ is in a state in which a plurality of ceramic green sheets are laminated.

Figure 15:
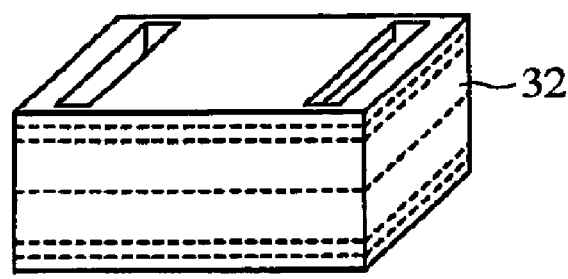
FIG. 15 is a perspective view of a ceramic green sheet laminate formed by laminating and compression-bonding the ceramic green sheets of FIG. 14.

Subsequently, as shown in FIG. 15, the ceramic green sheets 31$a$ to 31$f$ are laminated and compression-bonded to thereby form a ceramic green sheet laminate 32. Next, the ceramic green sheet laminate 32 is fired to thereby form a ceramic laminate 33 shown in FIG. 16.

Figure 17:
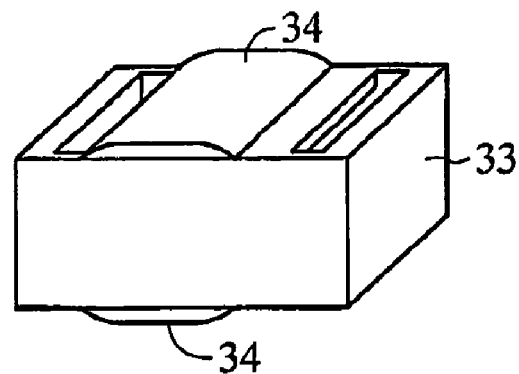
FIG. 17 is a perspective view of the ceramic laminate of FIG. 16 on which piezoelectric/electrostrictive laminates are formed.

Next, as in the case of the previously described piezoelectric/electrostrictive laminates 24, as shown in FIG. 17, the piezoelectric/electrostrictive laminates 34 are formed on the corresponding opposite sides of the ceramic laminate 33; i.e., on the corresponding surfaces of the fired ceramic green sheets 31$a$ and 31$f$.

Figure 18:
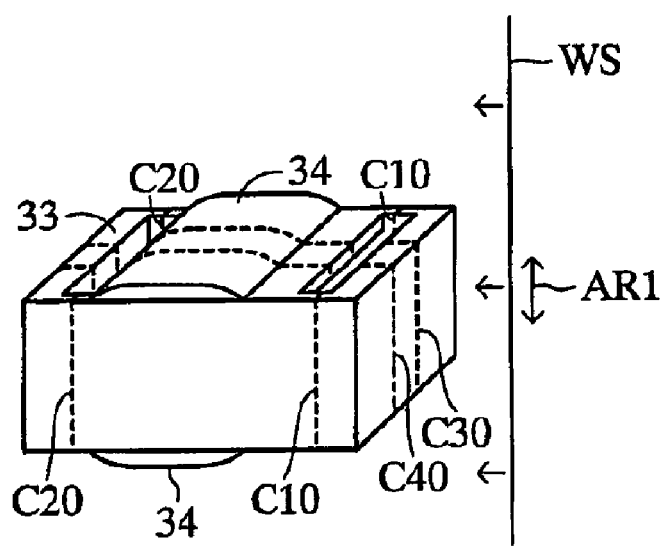
FIG. 18 is a view showing a cutting step for cutting the ceramic laminate and the piezoelectric/electrostrictive laminates shown in FIG. 17.

Next, unnecessary portions are cut away from the ceramic laminate 33 on which the piezoelectric/electrostrictive laminates 34 are formed. Specifically, the ceramic laminate 33 on which the piezoelectric/electrostrictive laminates 34 are formed is cut along cutting lines (broken lines) C10 to C40 shown in FIG. 18. Cutting can be performed by mechanical machining, such as wire sawing or dicing, as well as laser machining, such as YAG laser machining or excimer laser machining, or electron beam machining.

Among the above cutting methods, dicing is undesirable for the following reason. Cutting the ceramic laminate 33 and the piezoelectric/electrostrictive laminates 34 along the cutting lines (broken lines) C30 and C40 of FIG. 18 includes cutting the piezoelectric/electrostrictive laminates 34, whose strength is low. Thus, dicing, which imposes a large machining load on an object to be cut, is undesirable. Machining of another type whose machining load to be imposed on an object to be cut is small is desirable. Particularly, wire sawing is suited for such cutting, since wire sawing is suited for simultaneously forming a plurality of piezoelectric/electrostrictive devices 10 by means of simultaneous cutting and is small in machining load.

Wire sawing along the cutting lines C30 and C40 is performed in a manner similar to that of the first manufacturing method. Specifically, a wire saw WS is caused to advance along the cutting lines C30 and C40 while the wire saw WS is caused to reciprocate in a direction substantially parallel to the direction of lamination of the piezoelectric/electrostrictive laminates 34 as represented by the arrow AR1 of FIG. 18 and is held substantially parallel to the direction of lamination. As a result, the piezoelectric/electrostrictive device 10 is completed.

As in the case of the first manufacturing method, the second manufacturing method also uses the wire saw WS to cut the piezoelectric/electrostrictive laminate 34. Thus, as shown in FIGS. 11 and 12, a portion of each of the electrodes 14a1 to 14a5 of the piezoelectric/electrostrictive element 14, which portion forms the corresponding lateral end surface, extends onto the lateral end surfaces of the piezoelectric/electrostrictive layers 14b1 and 14b2, 14b2 and 14b3, or 14b3 and 14b4 between which the electrode is sandwiched, in such a manner as to partially cover the lateral end surfaces of the piezoelectric/electrostrictive layers. The lengths (thicknesses) L1 and L2 of each electrode satisfy the conditions specified in the first manufacturing method, As a result, on the lateral end surface of the piezoelectric/electrostrictive element 14, the distance between adjacent electrodes is increased, thereby reducing the susceptibility of adjacent electrodes to short circuit.

In the second manufacturing method, the overall length of the piezoelectric/electrostrictive device (length between the end of the holding portion 13 and the end of the stationary portion 11) is determined, not by cutting the fired body (ceramic laminate 33), but by machining the green sheets (by forming the windows We1 to We6 and the windows Wf1 to Wf4). As compared with the case of cutting the thick fired body, the overall length can be uniformly determined among products (the overall length can be accurately determined).

Figure 19:
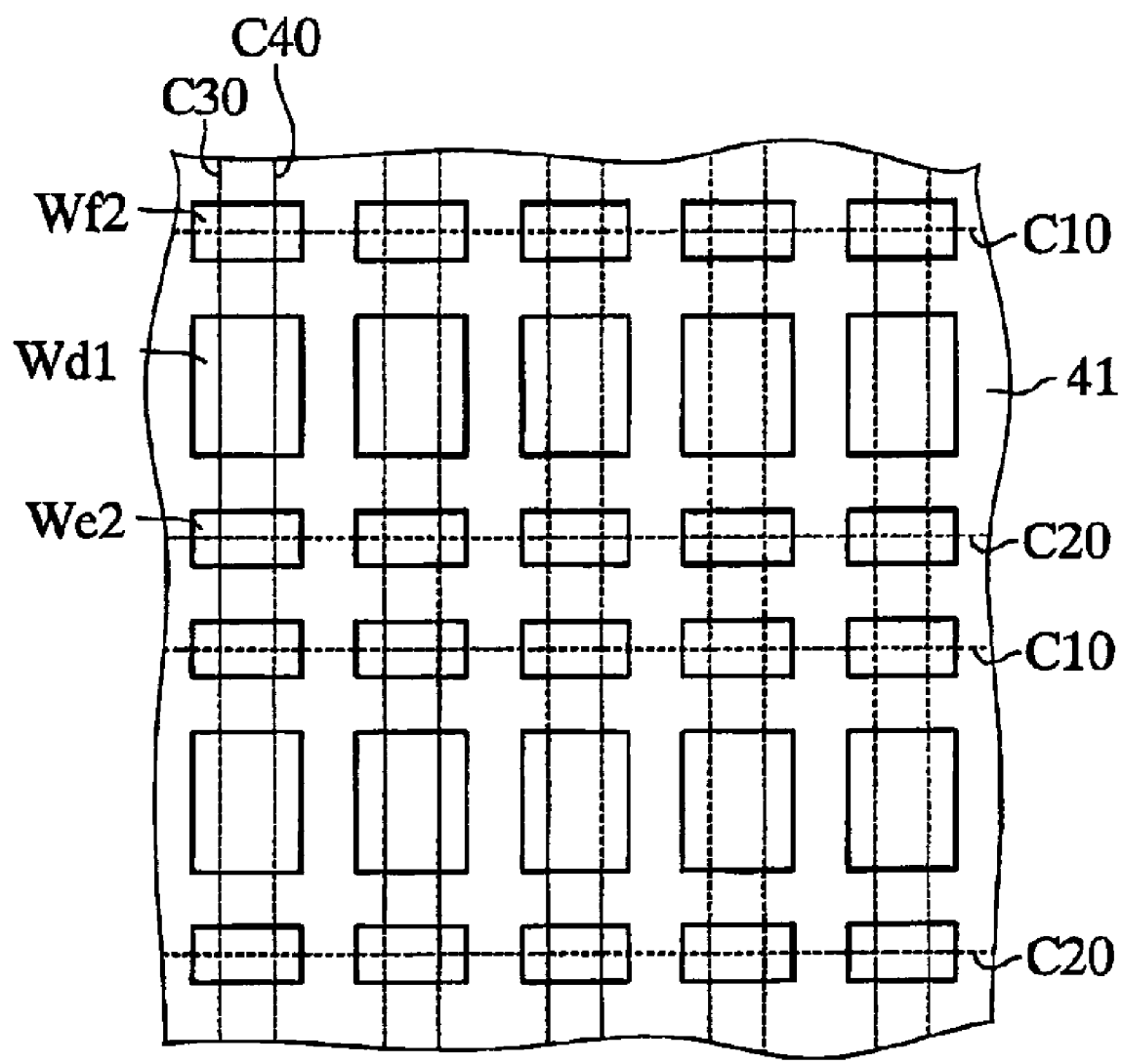
FIG. 19 is an enlarged fragmentary front view of a ceramic green sheet corresponding to the ceramic green sheet shown in FIG. 14.

Next will be described an example of ceramic green sheets to be used in actually manufacturing a plurality of piezoelectric/electrostrictive devices by use of the above-described second manufacturing method. FIG. 19 is an enlarged fragmentary front view of a ceramic green sheet 41 corresponding to the ceramic green sheet 31b shown in FIG. 14 (accordingly, also corresponding to the ceramic green sheet 31e). In FIG. 19, the broken lines correspond to the cutting lines C10 to C40 for the aforementioned ceramic laminate which is yielded as a result of firing. As is apparent from FIG. 19, when the mutually adjacent windows Wf2, Wd1, and We2 are taken as a single group of cavities, a single piezoelectric/electrostrictive device 10 per group of cavities is manufactured from the ceramic green sheet 41.

Figure 20:
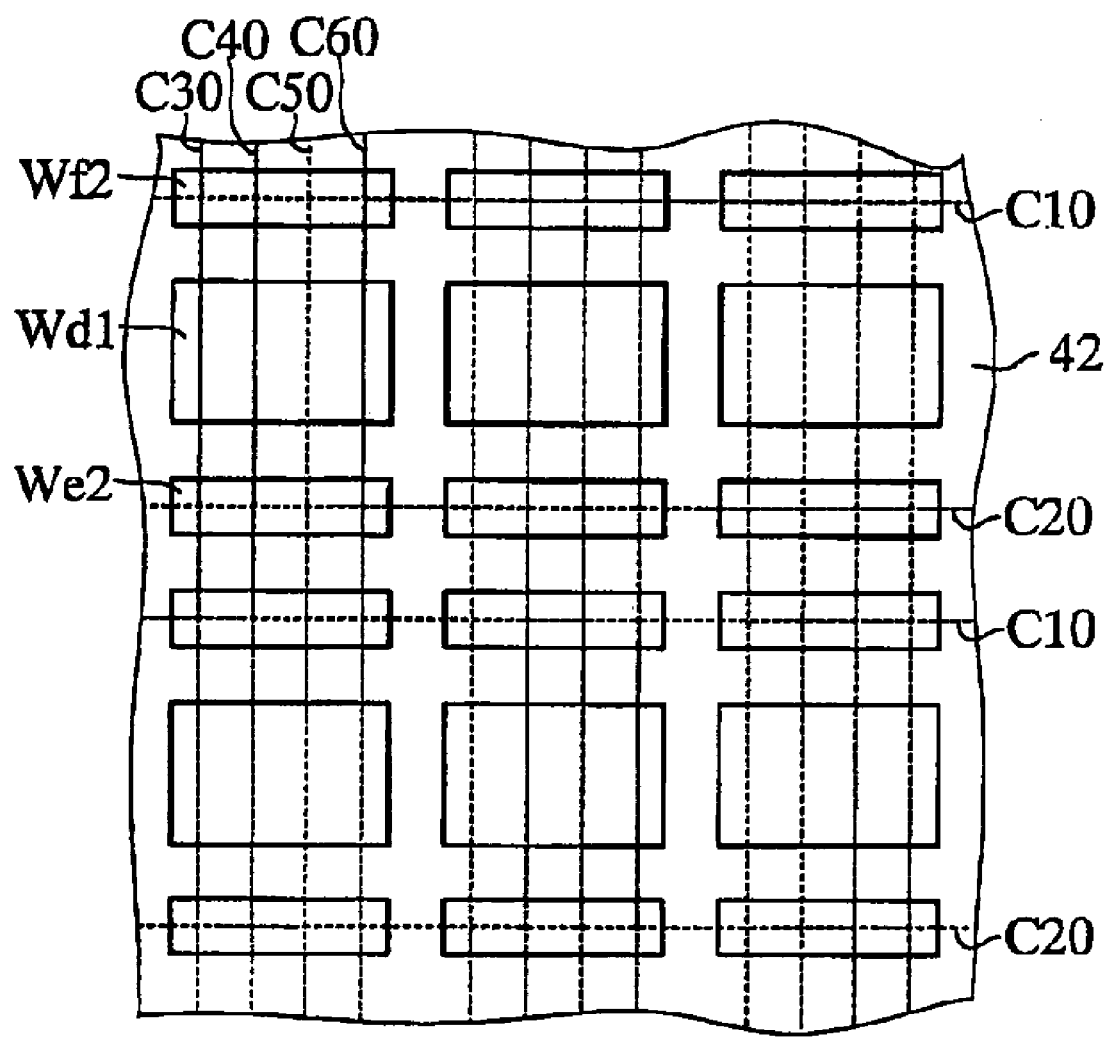
FIG. 20 is an enlarged fragmentary front view of another example of a ceramic green sheet corresponding to the ceramic green sheet shown in FIG. 14.
Figure 21:
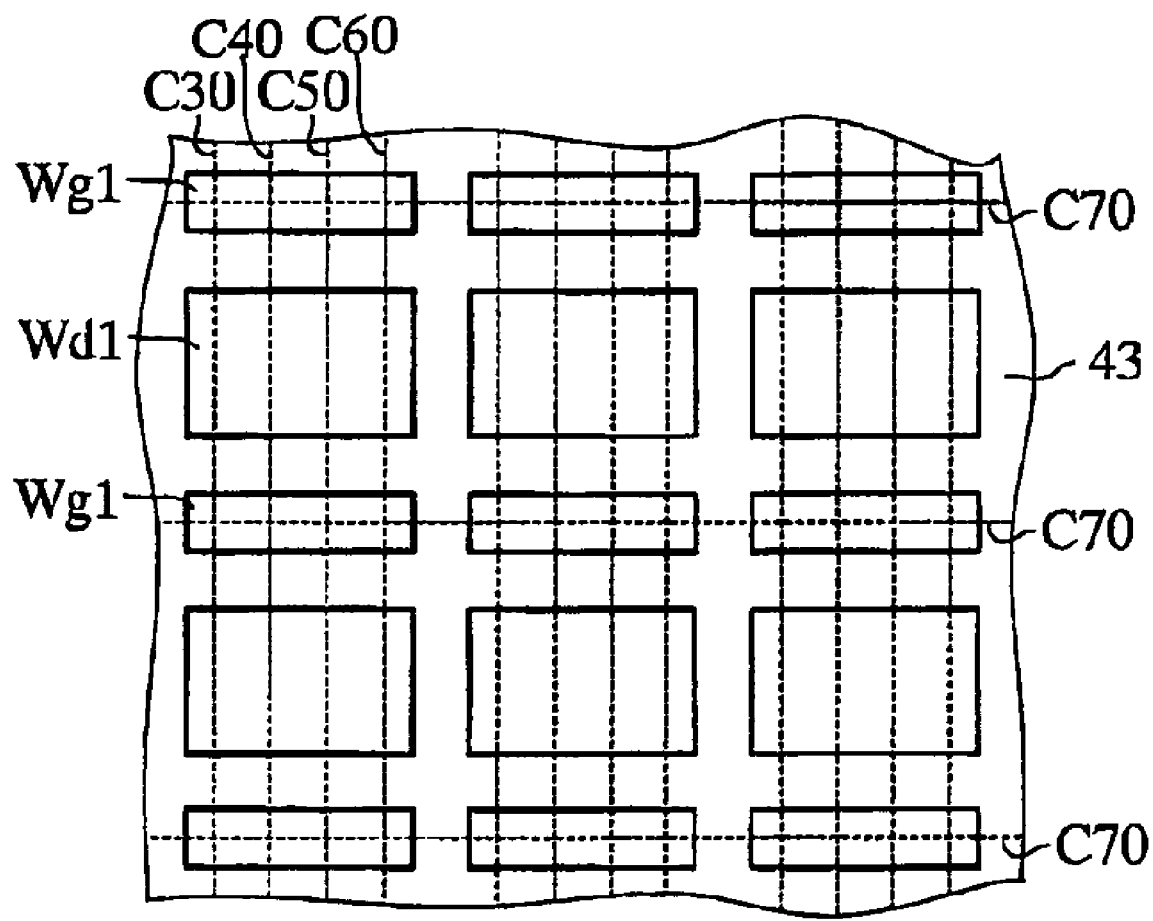
FIG. 21 is an enlarged fragmentary front view of still another example of a ceramic green sheet corresponding to the ceramic green sheet shown in FIG. 14.

FIG. 19 shows the ceramic green sheet 41 corresponding to the ceramic green sheets 31b and 31e shown in FIG. 14, however, needless to say, ceramic green sheets corresponding to the ceramic green sheets 31a, 31c, 31d, and 31f shown in FIG. 14 are prepared; the ceramic green sheets are laminated into a ceramic green sheet laminate that includes a plurality of ceramic green sheet laminates 32; the ceramic green sheet laminate is fired into a ceramic laminate that includes a plurality of ceramic laminates 33; and the ceramic laminate is used to manufacture a plurality of piezoelectric/electrostrictive devices (the same convention also applies to the following descriptions of FIGS. 20 and 21).

FIG. 20 is an enlarged fragmentary front view of another ceramic green sheet 42 corresponding to the ceramic green sheet 31b shown in FIG. 14 (accordingly, also corresponding to the ceramic green sheet 31e). In FIG. 20, the broken lines correspond to the cutting lines C10 to C40 for the aforementioned ceramic laminate which is yielded as a result of firing. In the present example, cutting lines C50 and C60 are added for the ceramic laminate. A ceramic green sheet laminate that includes the ceramic green sheets 42 is fired into a ceramic laminate. The ceramic laminate that includes the ceramic laminates 33 and the piezoelectric/electrostrictive laminates 34 is cut along the cutting lines C50 and C60. As is apparent from FIG. 20, when the mutually adjacent windows Wf2, Wd1, and We2 are taken as a single group of cavities, a number of (three in the illustrated example) piezoelectric/electrostrictive devices 10 per group of cavities are manufactured from the ceramic green sheet 42.

FIG. 21 is an enlarged fragmentary front view of still another ceramic green sheet 43 corresponding to the ceramic green sheet 31b shown in FIG. 14 (accordingly, also corresponding to the ceramic green sheet 31e).

In contrast to the above-mentioned ceramic green sheet 42, the ceramic green sheet 43 is such that the windows Wf2 and We2 of the ceramic green sheet 41 or 42 are integrated into a single window Wg1 and such that cutting is performed along a cutting line C70, which is an integrated cutting line of the aforementioned cutting lines C10 and C20, and along the cutting lines C30 to C60. Accordingly, when the window Wd1 and a pair of windows Wg1 located on opposite sides of the window Wd1 are taken as a single group of cavities, a number of (three in the illustrated example) piezoelectric/electrostrictive devices 10 per group of cavities are manufactured from the ceramic green sheet 43.

The ceramic green sheet 43 requires formation of only a single window Wg1, which is an integrated window of the windows Wf2 and We2 of the ceramic green sheet 41 or 42, instead of formation of the windows Wf2 and We2, thereby simplifying a preparation process (blanking process) for the ceramic green sheet 43. Also, the number of products available from the same sheet area can be increased.

Referring to FIGS. 19 and 20, the following cutting sequence (for yielding devices) is desirable. First, cutting is performed along the cutting lines C10 and C20, which longitudinally extend in the windows that determine the overall device length. Next, portions (substantially prismatic cut objects HS) remaining after removal of portions irrelevant to products (portions each sandwiched between the windows Wfn (Wf2) and Wen (We2) that are adjacent to each other without having the window Wdn (Wd1) therebetween (portions each sandwiched between the cutting lines C10 and C20 and not including the window Wd1)) are rearranged, for example, as shown in FIG. 32. Subsequently, wire sawing is performed along the cutting lines C30, C40, C50, and C60.

In the case of cutting shown in FIG. 21, cutting may be performed in a sequence similar to that for cutting shown in FIGS. 19 and 20 or may be performed in the reverse sequence. Specifically, first, wire sawing is performed along the cutting lines C30, C40, C50, and C60. Subsequently, cutting for determining the overall device length is performed along the cutting lines C70.

Supplementary description will next be given with respect to the above-described first and second manufacturing methods. Preferably, after cutting (cutting-off) is performed along the cutting lines C3 and C4 shown in FIG. 9 (along the cutting lines C30 and C40 shown in FIG. 18), the piezoelectric/electrostrictive laminates 24 (34) and the ceramic laminate 23 (33) are subjected to heat treatment at 300° C. to 800° C. The heat treatment can eliminate a defect, such as a microcrack, which is likely to occur in the piezoelectric/electrostrictive device 10 as a result of cutting, thereby enhancing reliability, Furthermore, preferably, after the heat treatment, the piezoelectric/electrostrictive laminates 24 (34) and the ceramic laminate 23 (33) are allowed to stand at a temperature of about 80° C. for about 10 hours so as to be aged. The aging treatment can alleviate various stresses and the like that are generated in the piezoelectric/electrostrictive device 10 in the course of manufacture.

The above-described piezoelectric/electrostrictive device according to the present invention can be used as active elements, such as various transducers, various actuators, frequency-domain functional components (filters), transformers, vibrators and resonators for use in communication and power applications, oscillators, and discriminators; and also as sensor elements for use in various sensors, such as ultrasonic sensors, acceleration sensors, angular-velocity sensors, impact sensors, and mass sensors. Also, the piezoelectric/electrostrictive device can be used as various actuators for use in mechanisms for displacement, positioning adjustment, or angle adjustment of various precision components in optical equipment, precision equipment, and like equipment.

While the present invention has been described with reference to an embodiment of the piezoelectric/electrostrictive device and an embodiment of the method for manufacturing the same, the present invention is not limited thereto, but may be modified as appropriate without departing from the scope of the invention. For example, the piezoelectric/electrostrictive element 14 of the above-described embodiment includes a plurality of electrodes 14a1 to 14a5 and a plurality of piezoelectric/electrostrictive layers 14b1 to 14b4. However, a piezoelectric/electrostrictive element including a pair of electrodes and a single piezoelectric/electrostrictive layer sandwiched between the paired electrodes can be employed in the piezoelectric/electrostrictive device of the present invention; and the method for manufacturing a piezoelectric/electrostrictive device according to the present invention can be applied to manufacture of the piezoelectric/electrostrictive device.

Specifically, the piezoelectric/electrostrictive device includes the stationary portion 11 of the above-described embodiment; the thin-plate portion 12 supported by the stationary portion 11; and a piezoelectric/electrostrictive element including a laminar first electrode (corresponding to the electrode 14a1 of the above-described embodiment) formed on a plane of the thin-plate portion 12, a piezoelectric/electrostrictive layer (corresponding to the piezoelectric/electrostrictive layer 14b1 of the above-described embodiment) formed on the first electrode, and a laminar second electrode (corresponding to the electrode 14a2 of the above-described embodiment) formed on the piezoelectric/electrostrictive layer. In the piezoelectric/electrostrictive device, a portion of the first electrode which portion forms a lateral end surface of the first electrode extends onto a lateral end surface of the thin-plate portion 12 and onto a lateral end surface of the piezoelectric/electrostrictive layer, in such a manner as to partially cover the lateral end surface of the thin-plate portion 12 and the lateral end surface of the piezoelectric/electrostrictive layer.

The piezoelectric/electrostrictive device is manufactured by a method that includes a step of forming a laminate adapted to form the piezoelectric/electrostrictive element, on a plane of a thin-plate member adapted to form the thin-plate portion 12 and a step of forming the thin-plate portion and the piezoelectric/electrostrictive element by advancing a wire member reciprocating in a direction substantially parallel to the direction of lamination of the laminate while holding the wire member substantially parallel to the direction of lamination, so as to cut the thin-plate member and the laminate.

Figure 7:
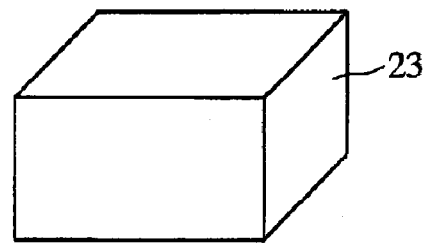
FIG. 7 is a perspective view of a ceramic laminate formed by monolithically firing the ceramic green sheet laminate of FIG. 6.
Figure 16:
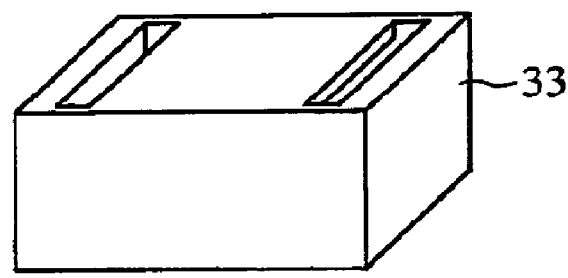
FIG. 16 is a perspective view of a ceramic laminate formed by monolithically firing the ceramic green sheet laminate of FIG. 15.

In the case where the stationary portion 11, the thin-plate portions 12, and the holding portions 13 are formed from a metal, in place of the ceramic laminate 23 shown in FIG. 7 or the ceramic laminate 33 shown in FIG. 16, a metal structure having the same shape as that of the ceramic laminates may be formed by casting. Alternatively, metal sheets whose shapes are identical with those of the ceramic green sheets shown in FIG. 5 or FIG. 14 may be prepared and laminated together by a cladding process to thereby form a metal structure having the same shape as that of the ceramic laminates 23 and 33.

Figure 22:
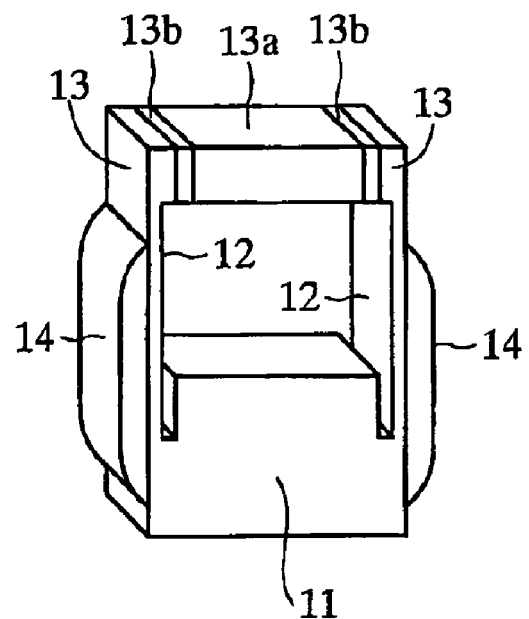
FIG. 22 is a perspective view of another variant of the piezoelectric/electrostrictive device of FIG. 1.
Figure 23:
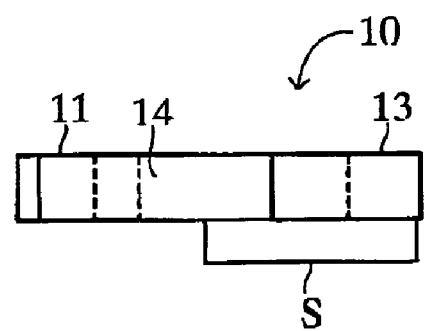
FIG. 23 is a view showing another example in which an object is held on the piezoelectric/electrostrictive device according to each of the embodiments.

In the piezoelectric/electrostrictive device 10 of the above-described embodiment, an object is held between the paired holding portions 13. However, as shown in FIG. 22, a spacer 13a may be held between the paired holding portions 13 via adhesives 13b. Furthermore, as shown in FIG. 23, an object may be held on lateral end surfaces (on lower surfaces in FIG. 23) of the holding portions of the piezoelectric/electrostrictive device according to the above-described embodiment by means of bonding or the like.

Figure 24:
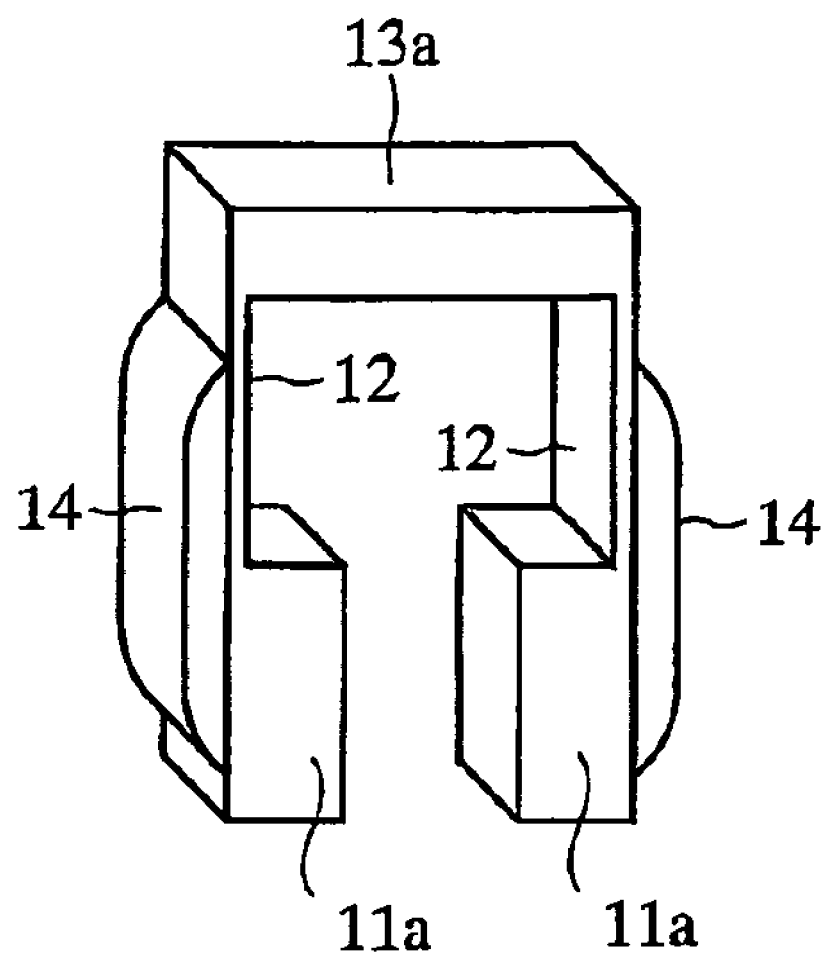
FIG. 24 is a perspective view of still another variant of the piezoelectric/electrostrictive device of FIG. 1.
Figure 25:
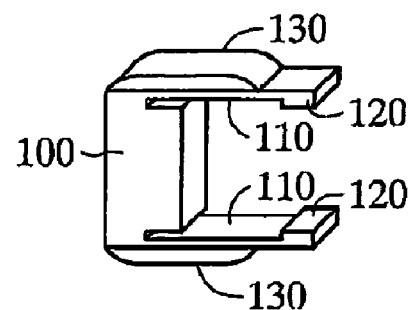
FIG. 25 is a perspective view of a conventional piezoelectric/electrostrictive device.
Figure 26:
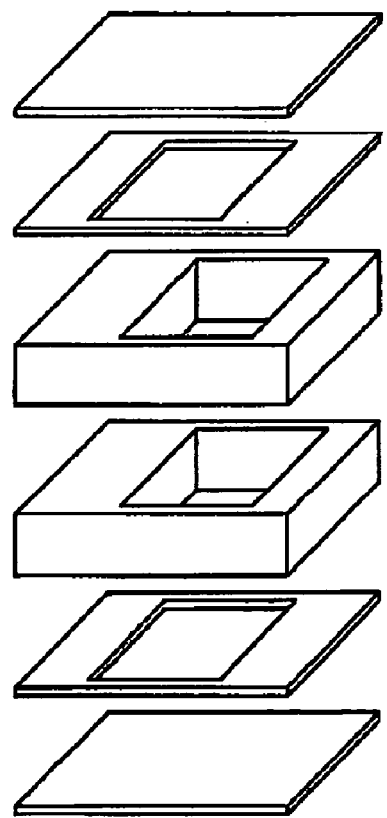
FIG. 26 is a perspective view of ceramic green sheets to be laminated in the process of manufacturing the piezoelectric/electrostrictive device of FIG. 25.
Figure 27:
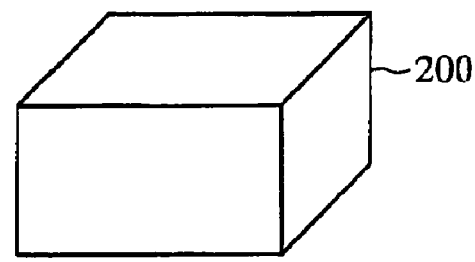
FIG. 27 is a perspective view of a ceramic laminate formed by monolithically firing a ceramic green sheet laminate formed by laminating and compression-bonding the ceramic green sheets of FIG. 26.
Figure 28:
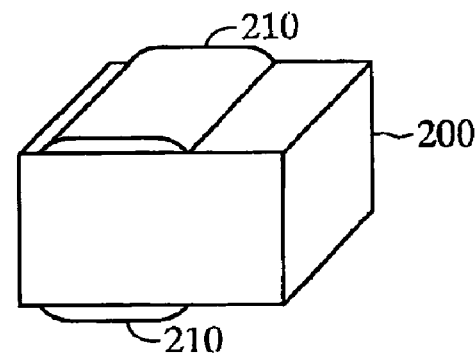
FIG. 28 is a perspective view of the ceramic laminate of FIG. 27 on which piezoelectric/electrostrictive laminates are formed.
Figure 29:
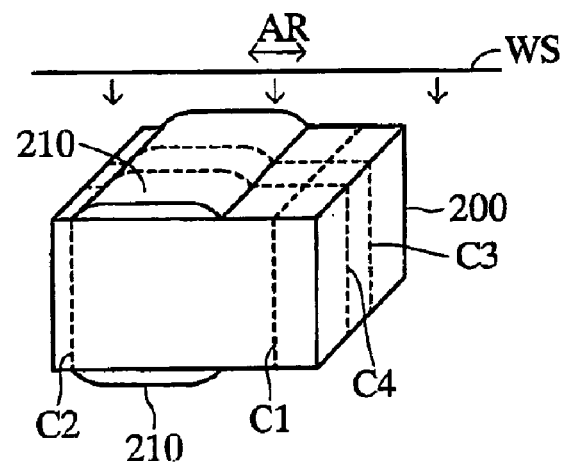
FIG. 29 is a view showing a cutting step for cutting the ceramic laminate and the piezoelectric/electrostrictive laminates shown in FIG. 28 in a manufacturing method other than that of the present invention.
Figure 30:
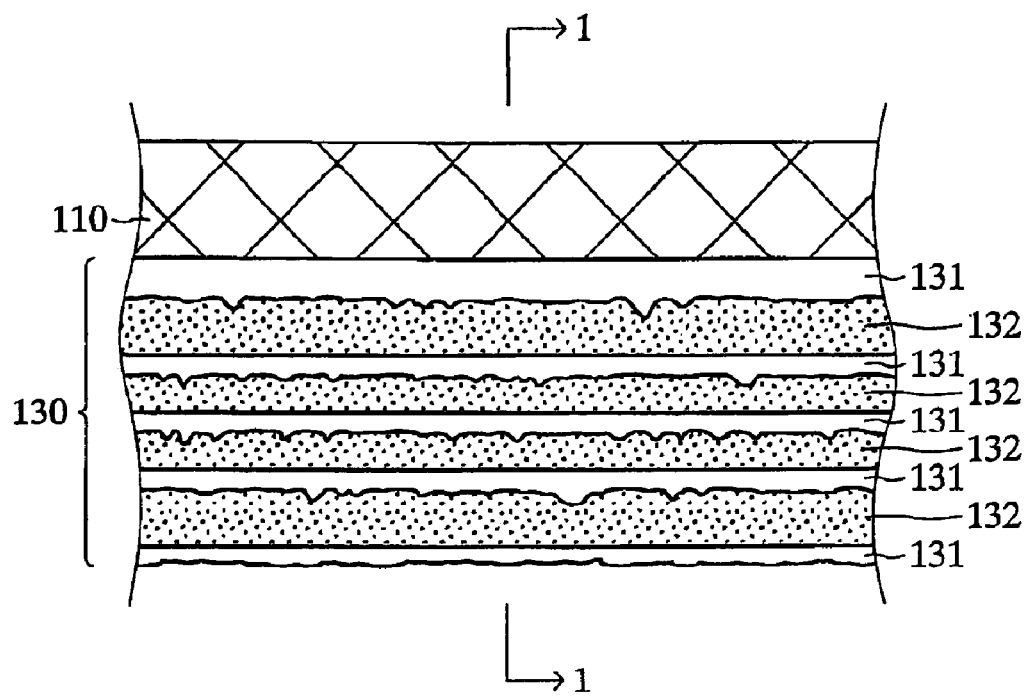
FIG. 30 is a fragmentary front view of a lateral end surface (cut surface) of the piezoelectric/electrostrictive element and the thin-plate portion shown in FIG. 25.
Figure 31:
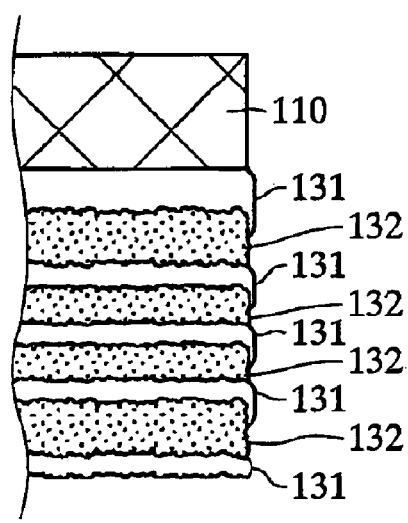
FIG. 31 is a fragmentary, sectional view taken along line 1—1 of FIG. 30 and showing the piezoelectric/electrostrictive element and the thin-plate portion.

Furthermore, the structure shown in FIG. 24 may be employed. Specifically, a central portion of the stationary portion 11 in the above-described embodiment is cut off to thereby form a pair of stationary portions 11a, so that the stationary portions 11a support the corresponding thin-plate portions 12. Tip end portions of the paired thin-plate portions 12 are integrally connected to thereby form a holding portion 13a.

The invention claimed is:

1. A piezoelectric/electrostrictive device comprising:
a thin-plate portion;
a stationary portion supporting the thin-plate portion; and
a piezoelectric/electrostrictive element formed at least on a plane of the thin-plate portion, the piezoelectric/electrostrictive element including a plurality of electrodes and a plurality of piezoelectric/electrostrictive layers arranged alternatingly in layers, and having an exteriorly exposed lateral surface including lateral surfaces of the plurality of electrodes and lateral surfaces of the plurality of piezoelectric/electrostrictive layers;
wherein a portion of each of the electrodes which portion forms the corresponding lateral surface extends onto both of the lateral surfaces of the piezoelectric/electrostrictive layers between which the electrode is sandwiched, in such a manner as to partially cover the lateral surfaces of the piezoelectric/electrostrictive layers.

2. A piezoelectric/electrostrictive device according to claim 1, wherein, on the lateral surface of the piezoelectric/electrostrictive element, the length (L2) of a portion of each electrode which forms the corresponding lateral surface of the electrode as measured in the direction of lamination of the piezoelectric/electrostrictive layers and the electrode is smaller than five times the length (L1) of the electrode as measured in the direction of lamination and on an imaginary plane (HPL) defined by the lateral surfaces of the piezoelectric/electrostrictive layers.

3. A piezoelectric/electrostrictive device according to claim 1, wherein a ratio of L3/L1 satisfies 0<L3/L1–2, where L3 is the length of the longer of parts of a lateral surface-forming portion of each electrode which portion forms the corresponding lateral surface of the electrode, the parts of the portion covering the corresponding lateral surfaces of the piezoelectric/electrostrictive layers between which the electrode is sandwiched, the length being measured in the direction of lamination of the piezoelectric/electrostrictive layers and the electrode; and L1 is the thickness, as measured in the direction of lamination, of the lateral surface-forming portion of the electrode after removal of the pans covering the corresponding lateral surfaces of the piezoelectric/electrostrictive layers from the lateral surface-forming portion of the electrode.

4. A piezoelectric/electrostrictive device comprising:
a thin-plate portion;
a stationary portion supporting the thin-plate portion; and
a piezoelectric/electrostrictive element formed at least on a plane of the thin-plate portion, the piezoelectric/electrostrictive element including a plurality of electrodes and a plurality of piezoelectric/electrostrictive layers arranged alternatingly in layers, and having an exteriorly exposed lateral surface including lateral surfaces of the plurality of electrodes and lateral surfaces of the plurality of piezoelectric/electrostrictive layers;

wherein the exteriorly exposed lateral surface of the piezoelectric/electrostrictive element is a surface formed by cutting a laminate of the electrodes and the piezoelectric/electrostrictive layers, in a direction substantially perpendicular to the direction of lamination of the laminate in a plane parallel to the direction of lamination.

5. A piezoelectric/electrostrictive device comprising:
a thin-plate portion; and
a piezoelectric/electrostrictive element comprising a laminar first electrode formed on a plane of the thin-plate portion, a piezoelectric/electrostrictive layer formed on the first electrode, and a laminar second electrode formed on the piezoelectric/electrostrictive layer;
wherein a portion of the first electrode which portion forms a lateral surface of the first electrode extends onto both a lateral surface of the thin-plate portion and a lateral surface of the piezoelectric/electrostrictive layer, in such a manner as to partially cover the lateral surface of the thin-plate portion and the lateral surface of the piezoelectric/electrostrictive layer.

* * * * *

UNITED STATES PATENT AND TRADEMARK OFFICE
CERTIFICATE OF CORRECTION

PATENT NO.       : 7,126,261 B2
APPLICATION NO.  : 11/007963
DATED            : October 24, 2006
INVENTOR(S)      : Kazuyoshi Shibata, Koji Ikeda and Masashi Watanabe It is certified that error appears in the above-identified patent and that said Letters Patent is hereby corrected as shown below:

Column 24

*Line 67*:   change "0<L3/L1-2" to --0<L3/L1<2--

Column 25

*Line 11*:   change "pans" to --parts--

Signed and Sealed this

Nineteenth Day of December, 2006

JON W. DUDAS
*Director of the United States Patent and Trademark Office*